(12) United States Patent
Hoyle et al.

(10) Patent No.: US 6,731,105 B1
(45) Date of Patent: May 4, 2004

(54) CURRENT SENSOR WITH CORRECTION FOR TRANSVERSE INSTALLATION MISALIGNMENT

(75) Inventors: Scott Baxter Hoyle, Mt. Laurel, NJ (US); Ertugrul Berkcan, Clifton Park, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 28 days.

(21) Appl. No.: 10/233,794

(22) Filed: Sep. 3, 2002

(51) Int. Cl.[7] .............................................. G01R 33/00
(52) U.S. Cl. ................................................. 324/117 R
(58) Field of Search ........................ 324/117 R, 117 H, 324/96, 207.2, 207.13, 207.21, 207.22

(56) References Cited

U.S. PATENT DOCUMENTS 6,642,704 B2 * 11/2003 Hastings et al. ......... 324/117 H
6,642,705 B2 * 11/2003 Kawase ................... 324/117 R

* cited by examiner

*Primary Examiner*—N. Le
*Assistant Examiner*—Vincent Q. Nguyen
(74) *Attorney, Agent, or Firm*—Duane Morris LLP

(57) ABSTRACT

Current is sensed in a physically large conductor by a pair of noncontacting, magnetically responsive corrected current sensors. The sensors each have a preferred magnetic sensing axis. A holding arrangement, which may be a printed-circuit board, holds the two current sensors with their axes spaced apart and parallel, to thereby define a sensing plane. The holding arrangement is placed near the conductor in which current is to be sensed, with the sensing plane parallel to a tangent to outer surface of the conductor. The current in the conductor is represented by the sum of the signals of the sensors. In the case of alternating current and sensors responsive to the absolute value of magnetic field, the summing includes subtraction.

27 Claims, 15 Drawing Sheets

YAW

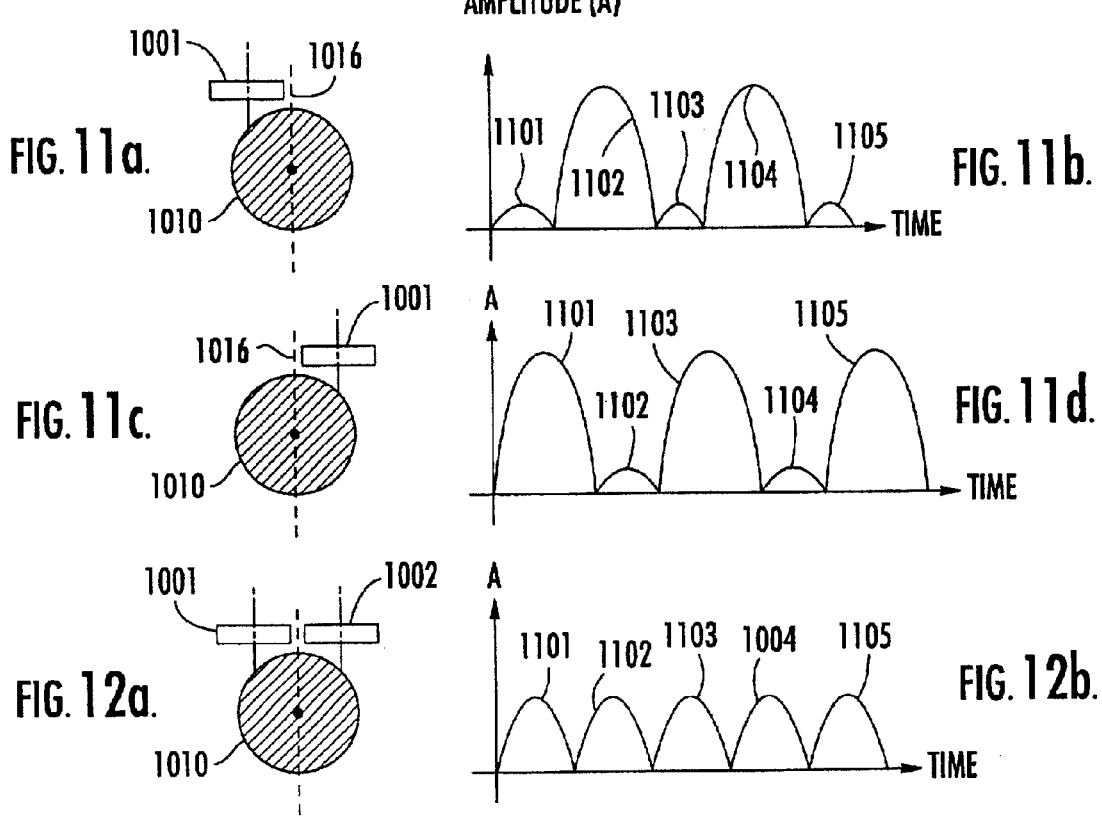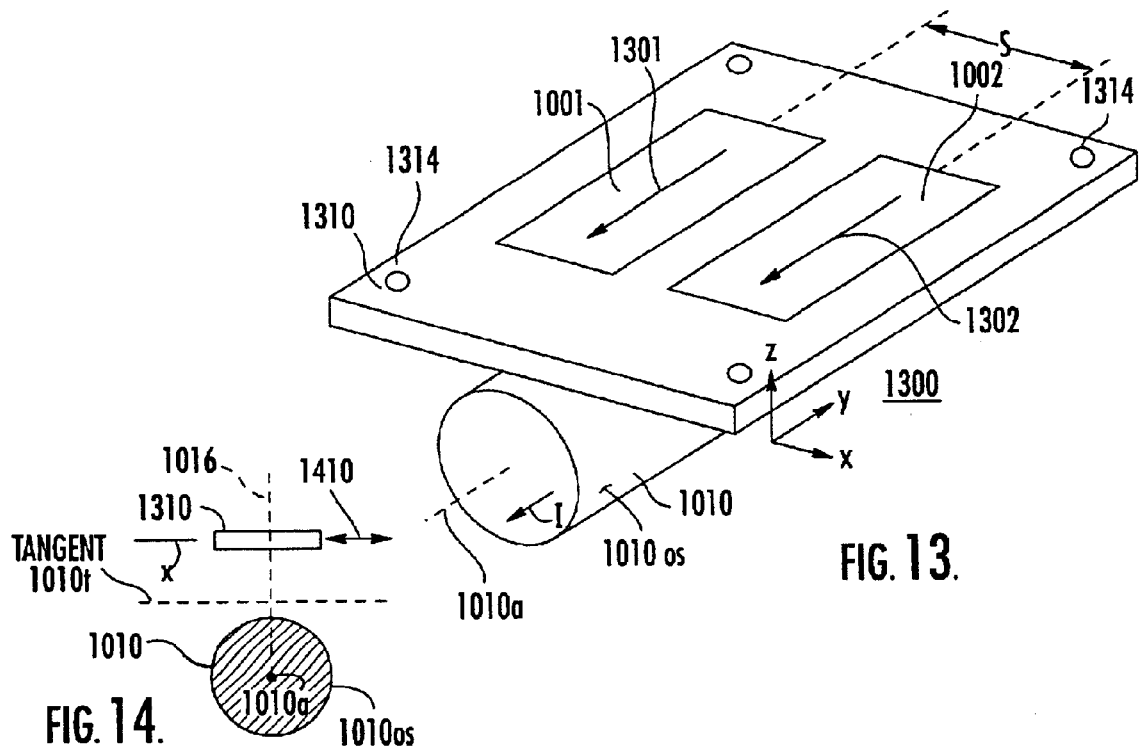

ROLL

TRANSVERSE

PITCH

YAW

CURRENT SENSOR WITH CORRECTION FOR TRANSVERSE INSTALLATION MISALIGNMENT

FIELD OF THE INVENTION

This invention relates to current sensors, and more particularly to corrected noncontacting current sensors which tend to be insensitive to transverse installation misalignment.

BACKGROUND OF THE INVENTION

In systems including a large number of interconnected devices, any one of which is liable to fail, troubleshooting can be difficult. Various techniques are used to aid in locating defective components. In the context of discrete circuits using bipolar transistors or FETs, it was previously common to place a moderate-value resistor in series with the base or gate, so that a short-circuit from the emitter or collector, or the source or drain, respectively, to the base or gate, could be detected by noting the voltage across the resistor so added. The value of the resistor was selected so that its effect on the operation of the circuit was minuscule during normal operation of the device. With the increased usage of microcircuits, this simple approach has become less useful.

There are systems in which large numbers of generally identical electrical units are operated in parallel. These systems are ordinarily located in bays of large racks, where the packing density of the units makes access difficult. In such arrangements, it is desirable to individually monitor the current flow to each module, as for example by associating a current sensor with each module. Each current sensor may be as simple as, again, a series resistor through which the current to be monitored flows, and which generates a voltage attributable to the power supply current flow to the module. A gross failure of a module might be readily identifiable by the existence of a relatively large voltage across the series resistor.

A more subtle failure, such as that of a single component within the module, might be identifiable as a momentary surge of the supply current as the failed component draws excessive current and then fails in an open-circuited state. Monitoring for such failures may require that a running record be kept of the supply current of each module. However, when a gross defect is noted, such as might occur when someone enters a room filled with racks of such equipment, and smells an "electrical fire" odor. Naturally, an immediate remedy is to cut all power to the equipment in the room. However, there is then the problem of tracking down the source of the odor. Since the odor vanishes shortly after the removal of power, and even were it present is not a good indicator of exact location, it may be difficult to locate the problem. In such an instance, it would be very valuable to have available a record of the moment-to-moment current in each module during the time in question, so as to be able to identify any current surges. With the use of microcircuits, mounted on printed-circuit boards, such a scheme would be quite possible, and might be relatively inexpensive to implement.

Naval and other ships contain large numbers of electrically driven motors, servos and the like, distributed throughout the various compartments of the ship. Many of these electrically driven devices could be styled as "heavy machinery." The same problem as that described above, namely that of locating a defective device within numerous other devices in close quarters, exists in the shipboard context. However, the problem is not as easy to solve in the ship context, because the currents involved are too large for ordinary printed circuits to withstand. This, in turn, means that the mounting of current sensors cannot be accomplished by simply connecting a circuit board in-circuit with the current to be sensed or measured, but instead the current sensor must be custom-installed on or adjacent the large conductor. Such installations tend to be labor-intensive and therefore expensive, and additionally are subject to installation errors which may compromise the measurements.

Improved current measurement techniques are desired, as for example for fault monitoring.

SUMMARY OF THE INVENTION

An electrical current sensor arrangement according to a general aspect of the invention is for sensing the current in an elongated conductor. The arrangement comprises first and second current sensing devices which can be magnetically coupled to the current to be sensed, for generating sensed signals relating to the magnitude of the current being sensed. Each of the first and second current sensing devices has a preferred magnetic sensing axis, which in general is oriented relative to the current flow in the conductor so as to provide a signal. A nonmagnetic physical mounting is physically coupled to the first and second current sensors, for holding the first and second current sensors with their preferred sensing axes one of (a) parallel and (b) orthogonal, thereby defining a sensor plane in which the current sensing devices lie. The fact that the current sensing devices lie in the same plane necessitates or requires a spacing therebetween, which spacing remains fixed. The physical mounting is adapted for mounting adjacent an electrical conductor, with the sensor plane parallel with a tangent with an outer surface of the electrical conductor, and for, when so mounted, holding the preferred sensing axes of the sensors relative to the direction of current flow in the conductor so as to produce a sensed signal in at least one, and preferably both, of the current sensing devices, in response to current flow in the conductor. As a result, each of the current sensing devices senses magnetic fields related to less than the total current flowing through the electrical conductor, or at least gives an indication which is less than it would give if properly located and oriented. The arrangement includes electrical coupling means coupled to the first and second current sensors, for processing the sensed signals produced by the first and second current sensors, to thereby produce a signal representative of the total current in the electrical conductor. In one embodiment, the conductor has a generally circular cross-section. Ideally, the current sensors are corrected for at least one of (a) temperature effects and (b) unit-to-unit variation in sensitivity. In the version in which the sensing axes of the current sensors are parallel, a transverse separation of the sensors is desirable.

In one version of the arrangement according to an aspect of the invention, the electrical coupling means algebraically sums the currents represented by the signals generated by the first and second current sensing devices to produce the signal representative of total current in the electrical conductor.

According to another aspect of the invention, the physical mounting comprises a first physical mounting portion physically coupled to the first and second current sensors, for holding the first and second current sensors with their preferred sensing axes (a) parallel or (b) mutually orthogonal, thereby defining a sensor plane, and with a fixed or known spacing between the preferred sensing axes. According to this aspect of the invention, a second physical mounting portion is provided for mounting adjacent an electrical conductor. The second physical mounting portion includes means for holding the first physical mounting portion with the sensor plane parallel with a tangent with (or to) an outer surface of the electrical conductor, and for, when so mounted, holds the preferred sensing axes (a) generally parallel with the direction of current flow in the electrical conductor or (b) at 45° to the direction of current flow. In one version of this aspect of the invention, the first physical mounting portion comprises a printed-circuit board, and the second physical mounting portion comprises a nonmagnetic structure including a printed circuit mounting portion defining a plane, and also including a depression shaped to the exterior of the conductor. The depression defines a longitudinal axis parallel with the plane of the printed circuit mounting portion.

In a kit of nonmagnetic mounting arrangements according to another avatar of the invention, each of the mounting arrangements includes first and second body arrangements. The first body arrangement defines (a) a mounting location for a pair of current sensors, each defining a preferred magnetic sensing axis, for mounting the pair of current sensors thereon with a specific or fixed distance between the current sensors, and with the preferred sensing axes parallel so as to define a sensing plane;

(b) a circularly cylindrical cavity defining a longitudinal axis parallel with the preferred magnetic sensing axes of the current sensors and also defining a first radius, for mounting to a cylindrical electrical conductor having a radius substantially equal to the first radius, the longitudinal axis of the cavity being parallel with the preferred sensing axes, and the sensing plane orthogonal to a plane in which plural radii of the cavity lie.

The second body arrangement defines (a) a second mounting location for a pair of current sensors, each defining a preferred magnetic sensing axis, for mounting the pair of current sensors thereon with the specific distance between the current sensors of the pair, and with the preferred sensing axes parallel so as to define a second sensing plane;

(b) a second circularly cylindrical cavity defining a second longitudinal axis parallel with the preferred magnetic sensing axes of the second pair of current sensors and also defining a second radius, different from the first radius, for mounting to a cylindrical electrical conductor having a radius substantially equal to the second radius, the longitudinal axis of the second cavity being parallel with the preferred sensing axes, and the second sensing plane orthogonal to a plane in which plural radii of the cavity lie.

Yet another embodiment of an avatar of the kit aspect of the invention lies in a kit of noncontacting magnetic sensors adapted for use with differing sizes of electrical conductors, where the kit comprises a first body arrangement. The first body arrangement defines (a) a mounting location for a pair of current sensors, each defining a preferred magnetic sensing axis, for mounting the pair of current sensors thereon with a specific distance between the current sensors, and with the preferred sensing axes parallel so as to define a sensing plane;

(b) a circularly cylindrical cavity defining a longitudinal axis parallel with the preferred magnetic sensing axes of the current sensors and also defining a first radius, for mounting to a cylindrical electrical conductor having a radius substantially equal to the first radius, the longitudinal axis of the cavity being parallel with the preferred magnetic sensing axes, and the sensing plane orthogonal to a plane in which plural radii of the cavity lie.

This other embodiment also includes a second body arrangement, the second body arrangement defining (a) a second mounting location for a pair of current sensors, each defining a preferred magnetic sensing axis, for mounting the pair of current sensors thereon with the specific distance between the current sensors of the pair, and with the preferred magnetic sensing axes parallel so as to define a second sensing plane;

(b) a second circularly cylindrical cavity defining a second longitudinal axis parallel with the preferred magnetic sensing axes of the second pair of corrected current sensors and also defining a second radius different from the first radius, for mounting to a cylindrical electrical conductor having a radius substantially equal to the second radius, the longitudinal axis of the second cavity being parallel with the preferred magnetic sensing axes, and the second sensing plane orthogonal to a plane in which plural radii of the cavity lie.

The kit also includes a pair of magnetically coupled current sensors, which are preferably corrected current sensors, each defining a preferred magnetic sensing axis, the pair of current sensors being dimensioned for mounting to any one of the first and second mounting locations of the first and second body arrangements, respectively.

A method for noncontact measurement of the current in a conductor according to another aspect of the invention includes the step of procuring two current sensors, preferably of the corrected type, each defining a preferred magnetic sensing axis. The current sensors are held with the preferred magnetic sensing axes mutually parallel and spaced apart from each other to define a sensor plane, and to also define a second plane parallel to the preferred magnetic sensing axes and orthogonal to the sensing plane. The sensor plane is held parallel to a tangent to an outer surface of a conductor through which current to be sensed flows, with the second plane approximately centered on the axis of the conductor. The magnetic fields about the conductor are sensed, to thereby produce current-representative signals from each of the current sensors. Finally, the current-representative signals from the two current sensors are summed to produce a signal representative of the actual current in the conductor.

In one mode of the method for noncontact measurement, the current to be sensed is an alternating current. In this mode, the step of procuring two current sensors includes the step of procuring two current sensors which respond to the absolute value of magnetic field, and the summing step includes the step of subtraction of one of the current-representative signals from the other. The processing can be performed in analog or digital form.

In accordance with another aspect of the invention, an apparatus for measuring current in a current-carrying conductor comprises a first current sensing device (preferably a corrected current sensing device) which can be magnetically coupled to the current to be sensed, for generating a sensed signal relating to the magnitude of the current being sensed. The first sensing device has a preferred magnetic sensing axis. A second current sensing device is included, which can be magnetically coupled to the current to be sensed, for generating a sensed signal relating to the magnitude of the current being sensed. The second current sensing device also has a preferred magnetic sensing axis. A nonmagnetic physical mounting is physically coupled to the first and second current sensors, for holding the first and second current sensors with their preferred magnetic sensing axes mutually orthogonal, thereby defining a sensor plane. The physical mounting is adapted for mounting adjacent an electrical conductor, with the sensor plane parallel with a tangent to an outer surface of the electrical conductor, for, when so mounted, holding the preferred magnetic sensing axes with a fixed angle between the direction of current flow in the electrical conductor and the preferred sensing axis of one of the first and second current sensors. An electrical coupling means or arrangement is coupled to the first and second current sensors, for processing the sensed signals produced by the first and second current sensors, to thereby produce a signal representative of the total current in the electrical conductor.

In one version of this apparatus, the electrical coupling means vectorially sums the currents represented by the signals generated by the first and second current sensing devices to produce the signal representative of total current in the electrical conductor. In a specific embodiment of this apparatus, the signals generated by the first and second current sensing devices are processed in accordance with the expression $$\sqrt{|S3|^2+|S4|^2}=\sqrt{S^2\sin^2(\Theta)+S^2\cos^2(\Theta)}=S,$$

where $\Theta$ is the angle between total current S and sensed current components S3 and S4, to produce a signal representative of the total current in the electrical conductor.

In another version of an apparatus according to the other aspect of the invention, the apparatus comprises first and second (preferably corrected) magnetic sensors, each of which first and second magnetic sensors has a preferred magnetic sensing axis. A first mounting means is coupled to the first and second magnetic sensors, for holding the first magnetic sensor with its preferred magnetic sensing axis orthogonal with the preferred magnetic sensing axis of the second magnetic sensor, to thereby define a sensing plane. Second mounting means are coupled to the first mounting means and to the conductor, for mounting the first mounting means adjacent (juxtaposed to) the conductor, with the sensing plane generally parallel to a tangent to an outer surface of the conductor. A summing means or arrangement is coupled to the first and second magnetic sensors, for vectorially summing the current-representative signals of the first and second magnetic sensors, so as to compensate, or in such a fashion as to correct, yaw misalignment of the preferred magnetic sensing axes of the magnetic sensors. In a particularly advantageous embodiment, the summing means performs its summing according to the expression $$\sqrt{|S3|^2+|S4|^2}=\sqrt{S^2\sin^2(\Theta)+S^2\cos^2(\Theta)}=S,$$

where S3 and S4 represent each sensor output, $\Theta$ the angle, and S the sum representing the total current.

In yet another version of the invention, a kit of nonmagnetic mounting arrangements is provided. Each of the mounting arrangements includes a first body arrangement, defining
(a) a mounting location for a pair of current sensors, each defining a preferred magnetic sensing axis, for mounting the pair of current sensors thereon with a fixed 45° angle between the preferred magnetic sensing axes of the current sensors, to thereby define a sensing plane;
(b) a circularly cylindrical cavity defining a longitudinal axis lying parallel with a line lying in the sensing plane and making a fixed 45° angle relative to the preferred magnetic sensing axes of the current sensors, and also defining a first radius, for mounting to a cylindrical electrical conductor having a radius substantially equal to the first radius, and with the sensing plane orthogonal to a plane parallel with the longitudinal axis; and
a second body arrangement, defining
(a) a mounting location for a pair of current sensors, each defining a preferred magnetic sensing axis, for mounting the pair of current sensors thereon with a fixed 45° angle between the preferred magnetic sensing axes of the current sensors, to thereby define a sensing plane;
(b) a circularly cylindrical cavity defining a longitudinal axis lying parallel with a line lying in the sensing plane and making a fixed 45° angle relative to the preferred magnetic sensing axes of the current sensors, and also defining a second radius different from the first radius, for mounting to a cylindrical electrical conductor having a radius substantially equal to the second radius, and with the sensing plane orthogonal to a plane parallel with the longitudinal axis.

Another kit of noncontacting magnetic sensors adapted for use with differing sizes of electrical conductors includes;
a first body arrangement, which first body arrangement defines
(a) a mounting location for a pair of current sensors, each defining a preferred magnetic sensing axis, for mounting the pair of current sensors thereon with a fixed 45° angle between the preferred magnetic sensing axes of the current sensors, to thereby define a sensing plane;
(b) a circularly cylindrical cavity defining a longitudinal axis lying parallel with a line lying in the sensing plane and making a fixed 45° angle relative to the preferred magnetic sensing axes of the current sensors, and also defining a first radius, for mounting to a cylindrical electrical conductor having a radius substantially equal to the first radius, and with the sensing plane orthogonal to a plane parallel with the longitudinal axis; and
a second body arrangement, which second body arrangement defines
(a) a mounting location for a pair of current sensors, each defining a preferred magnetic sensing axis, for mounting the pair of current sensors thereon with a fixed 45° angle between the preferred magnetic sensing axes of the current sensors, to thereby define a sensing plane;
(b) a circularly cylindrical cavity defining a longitudinal axis lying parallel with a line lying in the sensing plane and making a fixed 45° angle relative to the preferred magnetic sensing axes of the current sensors, and also defining a second radius different from the first radius, for mounting to a cylindrical electrical conductor having a radius substantially equal to the second radius, and with the sensing plane orthogonal to a plane parallel with the longitudinal axis The kit also includes a pair of magnetically coupled current sensors, which are preferably corrected current sensors, each of which sensors defines a preferred magnetic sensing axis, where the pair of current sensors is dimensioned for mounting to any one of the first and second mounting locations of the first and second body arrangements, respectively.

A method for noncontact measurement of the current in a conductor according to a further manifestation of the invention includes the step of procuring two current sensors, each defining a preferred magnetic sensing axis, and holding the current sensors with their preferred magnetic sensing axes mutually orthogonal, to thereby define a sensor plane. The sensor plane is held parallel to a tangent to an outer surface of a conductor through which current to be sensed flows. The magnetic fields about the conductor are sensed by the current sensors, to thereby produce current-representative signals from each of the current sensors. The current-representative signals from the current sensors are processed to produce a signal representative of the actual or total current in the conductor. In a particular version of the method, the step of processing includes the step of calculating $$\sqrt{|S3|^2+|S4|^2} = \sqrt{S^2\sin^2(\theta)+S^2\cos^2(\theta)} = S,$$

where S3 and S4 are signals representing the two sensor readings, S is the total current, and Θ the angle between the total current and S3.

BRIEF DESCRIPTION OF THE DRAWINGS

FIGS. 11a and 11c illustrate possible locations of the current sensor of FIGS. 10a and 10b, and FIGS. 11b and 11d illustrate the amplitude responses of the sensors in the positions represented by FIGS. 11a and 11c, respectively;

FIG. 12a illustrates the location of magnetically coupled current sensors according to an aspect of the invention, and FIG. 12b illustrates the combined amplitude response of the current sensors;

FIG. 13 is a simplified perspective or isometric view of a pair of magnetically coupled current sensors similar to that described in conjunction with FIG. 6a, mounted on a single mounting, with a fixed spacing therebetween, also illustrating the large current conductor;

FIG. 14 is a cross-sectional view of the arrangement of FIG. 13, showing the direction of tolerance to displacement;

FIG. 19b is a vector diagram relating to FIG. 19a.

DESCRIPTION OF THE INVENTION

According to an aspect of the invention, corrected current sensing devices of the magnetically coupled, noncontacting type are used to perform the actual measurements of current flow in the conductors of the equipments in which the current is to be monitored. The corrected current sensing devices are described in U.S. patent application Ser. No. 10/072,033 filed Feb. 7, 2002 in the name of Berkcan & Hoyle, entitled CURRENT SENSOR ARRANGEMENT WITH TEST CURRENT GENERATOR, and assigned to Lockheed Martin Corporation, the same assignee as the present application. According to another aspect of the invention, plural corrected current sensing devices are used, and the current in the conductor is determined by summing the currents represented by the plural corrected current sensing devices. When the magnetic sensors are absolute-value devices, the summing includes subtraction.

Figure 1A:
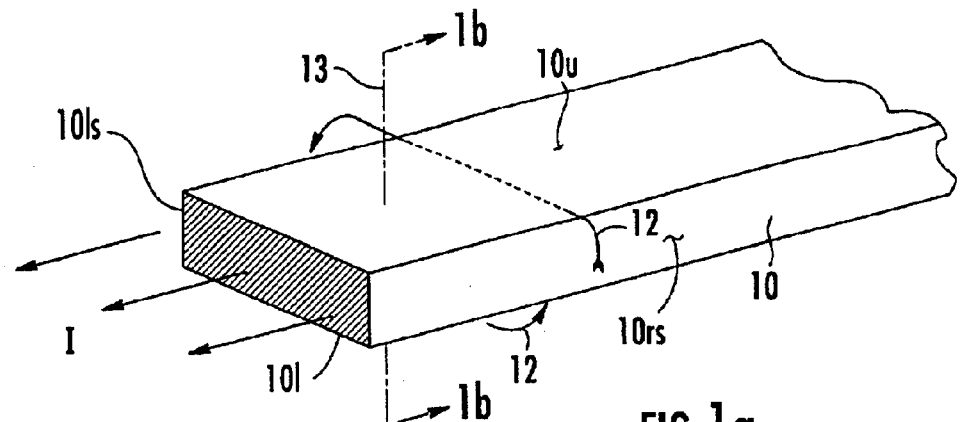
FIG. 1a is a simplified perspective or isometric view of a portion of an elongated electrical conductor through which a current to be measured flows, showing the magnetic field structure.
Figure 1B:
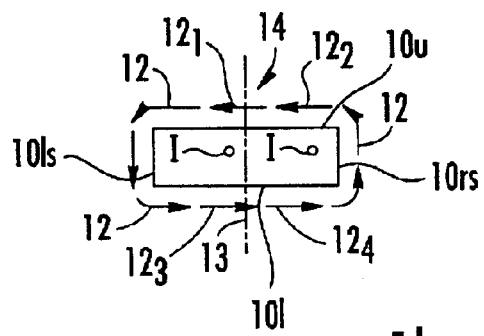
FIG. 1b is a cross-sectional view of the conductor looking in direction 1b—1b, showing that the magnetic field is roughly planar in a region around the conductor.

A portion of an elongated conductor 10 is illustrated in FIG. 1, as described by Berkcan & Hoyle. Conductor 10 is not circular, but is instead generally flattened to define a pair of mutually parallel broad surfaces 10u, 10l and a pair of mutually parallel narrow surfaces 101s and 10rs. Conductors so shaped are commonly the result of fabrication of printed circuit traces. The conductor carries an unknown or subject current I which is to be measured. Current I of FIG. 1a causes a magnetic field illustrated by field lines designated 12. A theoretical bisector designated 13 extends through the broad surfaces, roughly orthogonal to those broad surfaces. Reference to FIG. 1b allows the general configuration of the magnetic field lines to be visualized as including a generally "flat" or planar portion or region 14 near the bisector 13. More particularly, field lines $12_1$, $12_2$, $12_3$, and $12_4$ can be seen to be substantially straight and mutually parallel, thereby defining two planes extending back into the FIGURE. Thus, flow of the unknown or subject current to be measured results in a (actually two) generally planar magnetic field components near the bisector of the conductor.

Figure 2A:
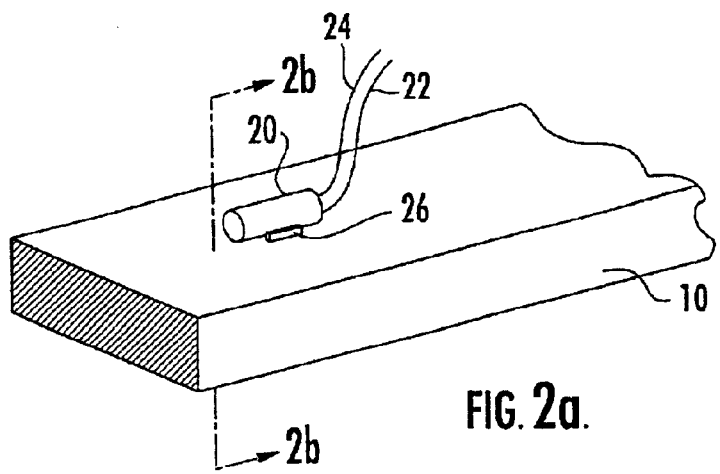
FIG. 2a is a simplified perspective or isometric view of a portion of a current sensor arrangement as described in a patent application filed in the name of Berkcan & Hoyle, which includes a portion of the conductor of FIG. 1a, and FIG. 2b is a cross-sectional view thereof looking in direction 2b—2b.
Figure 2B:
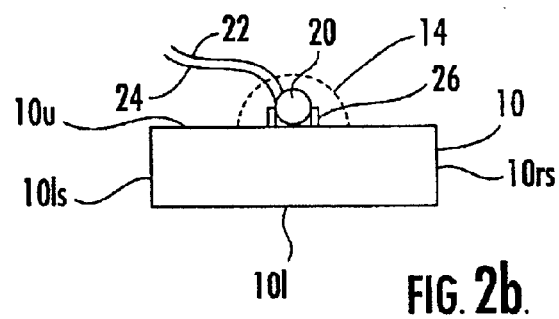

FIG. 2a illustrates elongated conductor 10 associated with a magnetic field sensing or measuring device 20, which can be held in place by any desired means, such as by adhesive 26. Magnetic field sensing device 20 senses magnetic fields roughly within planar-magnetic-field spatial region 14, the general location of which is suggested by the region enclosed by the dash lines 14 in FIG. 2b. The magnetic field sensing device 20 is illustrated as a featureless cylinder, as its shape is irrelevant. Magnetic field sensing device 20 may be of any one of a number of types, including Giant Magneto-Resistive (GMR) devices or Spin Dependent Tunneling (SDT) devices. These devices are relatively small, and lend themselves to packaging in integrated-circuit chip carriers. Thus, the shape of the carrier is not particularly relevant to the operation.

It should be noted that at least some of the magnetic field sensing devices 20 which may be used in some current sensor arrangements described in the abovementioned Berkcan & Hoyle application are preferentially sensitive to magnetic fields flowing in a particular direction therethrough. The different types are variously known as "perpendicular" or "orthogonal" in which the maximum sensitivity is to magnetic field lines transverse to the plane of the device, and "lateral" in which maximum sensitivity is to magnetic fields lying parallel to the plane of the device. This need not concern us, since the magnetic field sensing device 20 of FIGS. 2a and 2b can always be mounted in an orientation relative to the magnetic field in the planar region 14 which maximizes its sensitivity, depending upon its characteristics; this may be termed a "preferred" axis or orientation. The magnetic field sensing device 20 may require energization, which can be provided from an external source by wires, one of which is illustrated as 22. In any case, the magnetic field sensing device 20 produces a sensed voltage which, within a linear range, is roughly proportional to the magnetic field in its vicinity. This voltage can be taken from the magnetic field sensing device 20 by means of wires, one of which is illustrated as 24, for use by a utilization device.

Figure 3:
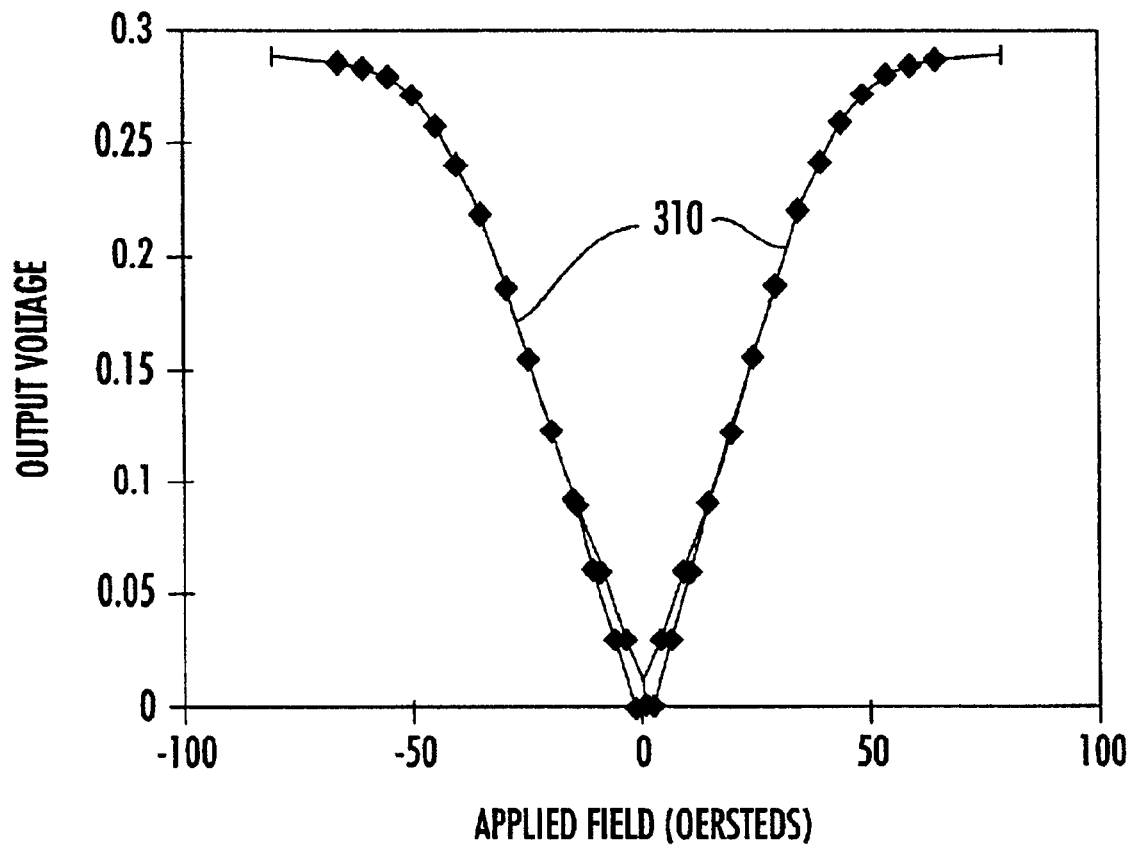
FIG. 3 is a plot of average voltage/magnetic field performance of a Giant Magneto Resistive device.

FIG. 3 illustrates a plot 310 illustrating typical output voltage versus magnetic field strength for a Giant Magneto-Resistive device. It will be noted that the plot is quite straight in the region ranging from zero field to about 25 Oersteds. If this portion of the plot is used to make measurements, there is a substantial correspondence or correlation between the sensed voltage and the magnetic field in the vicinity 14 of the magnetic sensing device 20 of FIG. 2b. Unfortunately, the GMR sensors vary substantially from unit to unit, so the voltage reading produced by a randomly selected GMR cannot be relied upon to provide an accurate indication of magnetic field strength. Even if the GMR is selected to have response close to that of plot 310, it will be found that the response varies as a function of GMR temperature, so that even selection of the GMR cannot provide a reliably accurate indication of the magnetic field in the vicinity of the magnetic sensing device, and therefore also cannot provide a reliably accurate indication of the current in conductor 10 of FIGS. 2a and 2b. A selection process is expensive, and would result in a costly current sensor arrangement. Very costly sensors would militate against their widespread use in a shipboard environment (or in any other environment, for that matter), which would tend to limit their usefulness in replacing human observations or readings, contrary to the desired reduction in ship crew requirements.

According to an aspect of the invention, each current sensor arrangement is "continually" or recurrently normalized, compensated, or tested, so that its sensitivity is known at, or near, the moment in time at which the measurement is made. In short, this is accomplished by generating a "known" test or bias magnetic field component within the spatial region in which the magnetic sensing device lies, and processing the resulting information together with information obtained during non-test times, to determine the magnitude of the subject current flowing through the elongated conductor. More particularly, as illustrated by the current sensor arrangement 400 in the simplified schematic diagram of FIG. 4a, a test or bias current generating circuit designated generally as 410 includes a "current" source designated generally as 412, which includes a voltage source illustrated as a battery 414 and two resistors, namely resistors 416 and 418. Those skilled in the art know that a voltage source produces voltage and, when connected in a circuit, also produces current. In order to isolate the voltage source 414 from the conductor 10, the connections of voltage source 414 to conductor 10 are made by way of resistors 416 and 418. More particularly, resistor 416 connects the negative terminal of voltage source 414 to conductor 10 "downstream" (relative to the direction of current flow in conductor 10) from planar-magnetic-field region 14, and resistor 418 connects the positive terminal of voltage source 414 to conductor 10 "upstream" from region 14. In the particular circuit illustrated in FIG. 4a, voltage source 414 cannot be connected directly to the conductor 10 without some resistance in the circuit, because large currents would be likely to flow in the resulting circuit, possibly damaging the conductor 10, the voltage source 414, or at least potentially increasing the magnetic field within region 14 to a point at which the magnetic sensing device 10 becomes nonlinear. Thus, in the circuit of FIG. 4a, the resistors 416 and 418 serve dual functions, namely isolation of the voltage source from the circuit to which conductor 10 is connected, and also converting the voltage source 414 into a current source designated as 412. In operation of the circuit of FIG. 4a, the test current $I_{test}$ flows around the circuit including voltage source 414, resistor 418, conductor 10 in region 14, and resistor 416. The subject current $I_{subject}$ to be measured flows through conductor 10 as a result of a source circuit (not illustrated). In region 14 in which sensor 20 interacts with the planar magnetic field, the subject current $I_{subject}$ and the test current $I_{test}$ either add or subtract, depending upon their relative polarities. With the current directions indicated by the arrows in FIG. 4a, the currents add. Thus, the current generating the magnetic field within region 14 is the vector sum (the "sum") of the subject current and the test current.

Figure 4A:
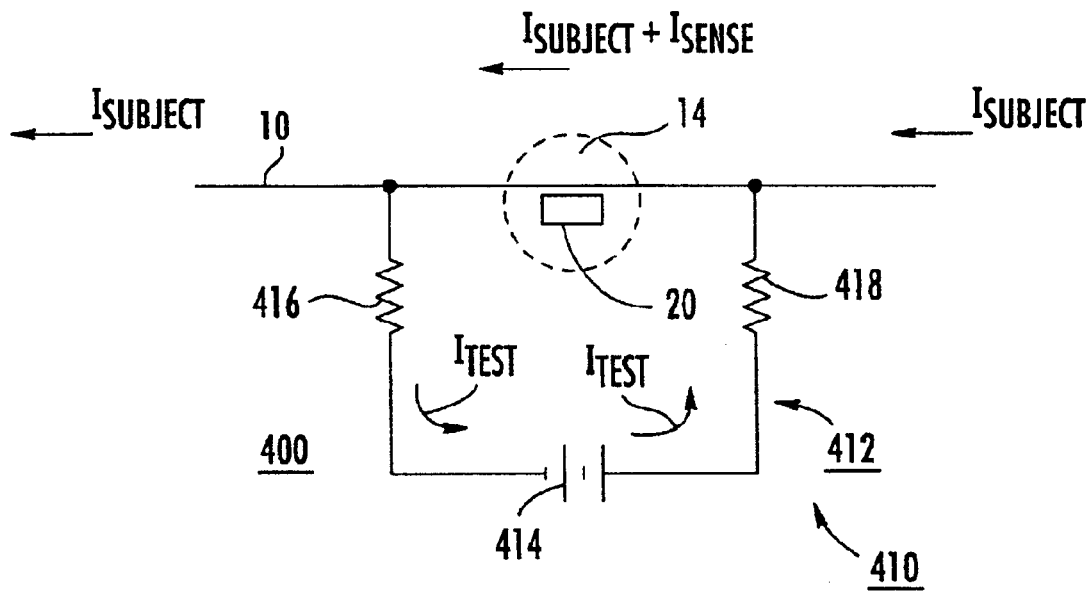
FIG. 4a is a simplified schematic diagram of a magnetic field sensing or measuring device associated with a subject-current carrying conductor and a test current generator which causes test current to flow in the same conductor with the subject current.
Figure 4B:
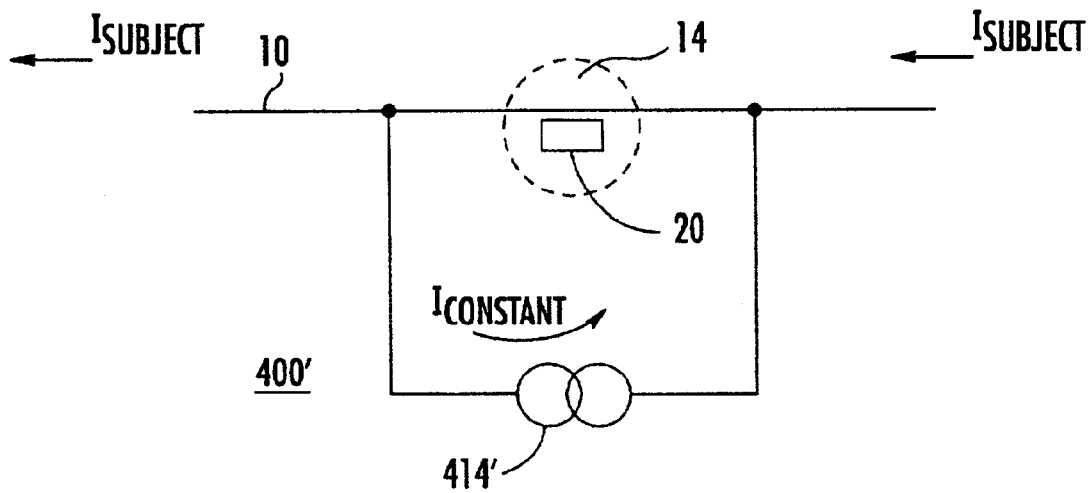
FIG. 4b illustrates a variant thereof.

The term "current source" sometimes connotes an electrical source having a high impedance, so that variations in the load do not affect the current. Such a use of the term "current source" makes it equivalent to the term "constant-current source." Such circuits exist and for the most part use feedback principles to tend to maintain a given value of current, and in principle such a source will produce any voltage which may be required in order to make the design current flow. In actual practice, of course, these circuits have limits on the amount of voltage which can be generated, and so in the limit the constancy of the current fails. FIG. 4b illustrates a current-sensing arrangement 400' including a circuit similar to that of FIG. 4a, in which a constant-current source 414' is connected as a test current source. Constant-current source 414' of FIG. 4b has its terminals connected to conductor 10 on either side (meaning on both sides) of region 14, as was the case in FIG. 4a. The difference between FIGS. 4a and 4b lies in the fact that the test current source in FIG. 4b is a "current" source having, in principle, a high internal impedance. The high impedance prevents any voltage which may occur across its terminals from affecting the constancy of the current. Thus, it would appear to be superior to the arrangement of FIG. 4a. However, the apparent simplicity of the arrangement of FIG. 4b may not be realized in practice, since the constant-current source 414' is actually itself a circuit, which has components which must be protected from harmful surges and noise. Thus, in practice the arrangement of FIG. 4b may require resistors similar to those of FIG. 4a simply for protection of the constant-current source, or alternatively to provide a convenient test location for determining the existence of current flow. Regardless of whether a voltage source with resistors or a high-impedance constant-current source is used, the magnitude of the test current will be known. In the case of a voltage source with resistors, the current I will the equal to the voltage E divided by resistance R, so that I=E/R as known in the art, and in the case of a high-impedance current source the test current will be the design current.

According to a further hypostasis of the invention, a gating or control arrangement is provided, which gates the test current source 410 on a recurrent basis, which is to say from time to time. The recurrence may be periodic or nonperiodic, but periodic systems are well known and simple to make, and so may be preferred. The test current is recurrently gated ON and OFF. As a result, the test current will be summed with the subject or unknown current flowing in conductor 10 to produce a magnetic field in region 14 which includes components attributable to the subject current and the test current. As the test current is gated ON and OFF, the net current producing the relevant magnetic field will change by an amount representative of the test current. If the test current sums with the subject current additively, as illustrated in FIGS. 4a and 4b, the magnetic field experienced by magnetic sensing device 20 will increase during those intervals in which the test current source is ON.

Figure 5A:
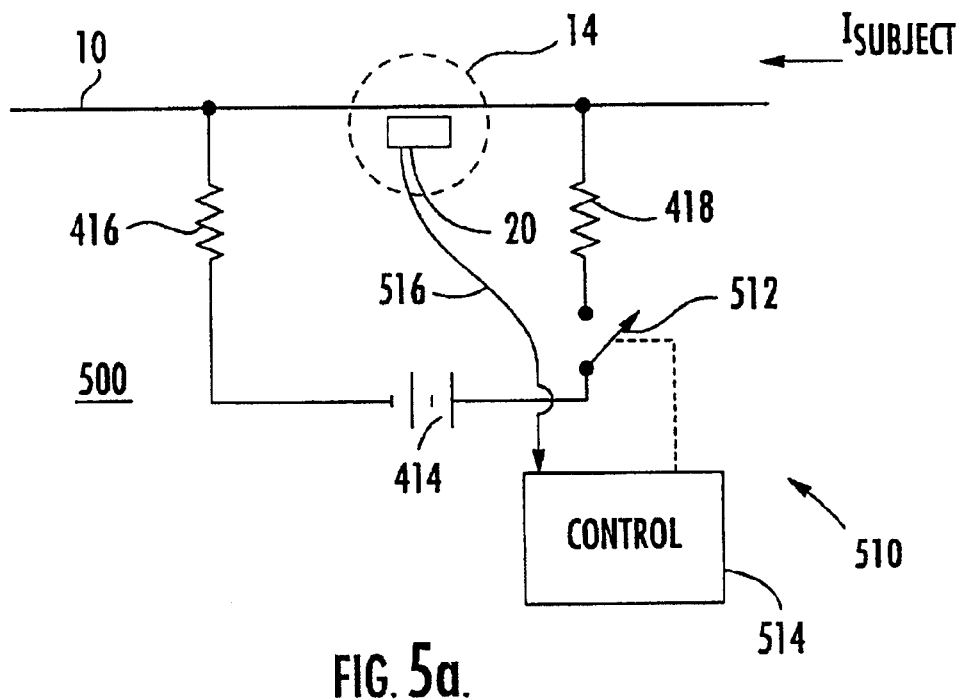
FIG. 5a is a simplified diagram in block and schematic form of a current sensor arrangement as described by Berkcan & Hoyle, illustrating one method for switching a test circuit generator ON and OFF.

FIG. 5a is a simplified diagram in block and schematic form illustrating another avatar of the invention. In FIG. 5a, elements corresponding to those of FIG. 4a are designated by like reference numerals. In FIG. 5a, the current sensor arrangement 500 includes a source 510, which includes voltage source 414 and resistors 416 and 418. In addition, test current source 510 includes a switch 512 illustrated as a mechanical switch in accordance with conventions of the art. There are other conventions which might be used, but the one selected is suitable for explanatory purposes. Those skilled in the art know that mechanical switches or relays are seldom used, as solid-state devices are often sufficient. Switch 512 is connected in-circuit with the test current source, so that the test current path is broken when the switch 512 is open or non-conductive. When the test current path is opened or broken, the test current ceases.

Switch 512 of current sensor arrangement 500 of FIG. 5a is controlled, according to this other aspect of the invention, by a control circuit 514, which also receives sensed voltage from magnetic sensing device 20 by way of a path illustrated as a conductor 516. It is advantageous for control circuit 514 to control switch 512, because the fact of control provides control circuit 514 with some of the information it needs in order to determine the subject current, namely the times when the test current is ON and those in which it is OFF. In the absence of control of switch 512 by control circuit 514, the switch 512 would have to be controlled by some other entity. In that case, control circuit 514 could communicate with the control entity or with the switch itself to determine the switch state, or the control circuit could attempt fancy processing akin to correlation to attempt to determine the test and non-test intervals. However, assuming that control circuit 514 "knows" the state of switch 512 and the magnitude of the test current, it is in a position to determine the magnitude of the subject current.

Figure 5B:
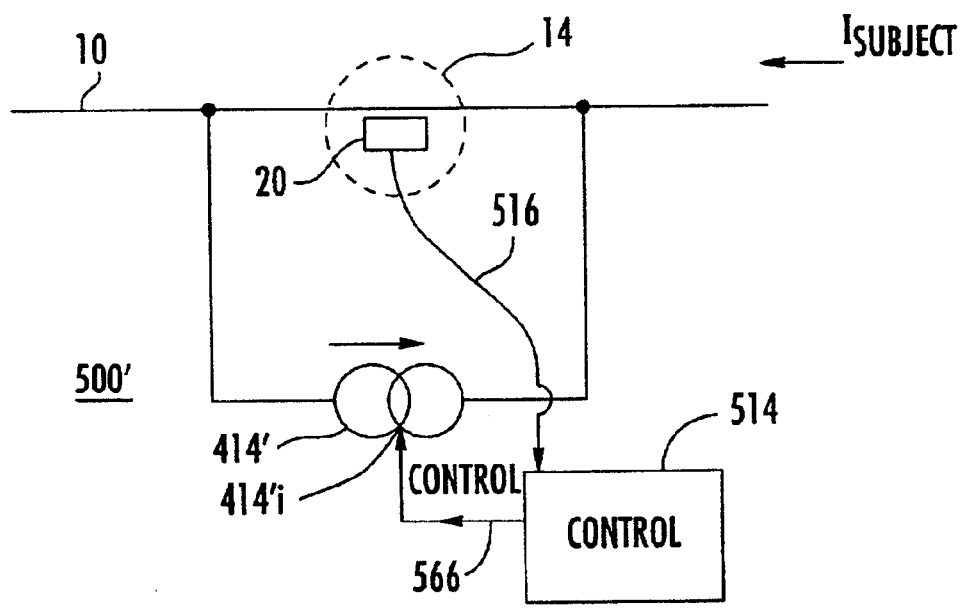
FIG. 5b illustrates an alternative version thereof.

FIG. 5b illustrates as an alternative embodiment a current sensor arrangement 500', in which a high-impedance test current source is controlled, over a path 566, by a control circuit 514'. Since, in principle, the current source will produce any voltage, however high, in order to cause the current to flow, it is not possible to open the test current circuit by means of a switch as in FIG. 5a. Instead, the high-impedance constant-current source 414' is recurrently gated ON and OFF by a control signal applied to a gating input port 414'i.

Figure 6A:
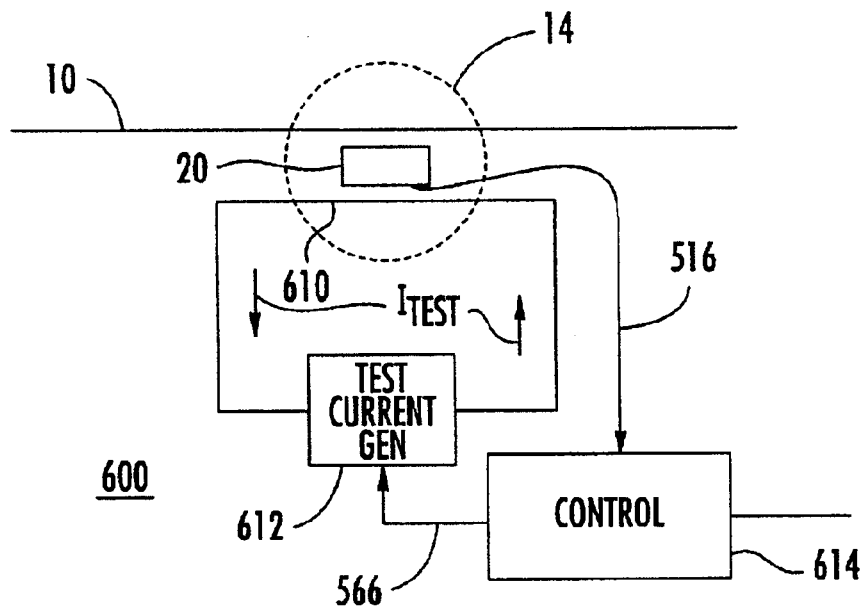
FIG. 6a is a simplified diagram in block and schematic form of a current sensor arrangement, in which the test current flows through a second path, independent of the path in which the current being measured flows.

FIG. 6a illustrates a scheme for generating the test magnetic field component in region 14 by passing the test current $I_{test}$ from a test current generator 612 through a conductor 610 which parallels conductor 10 in region 14. Conductor 610 is electrically or galvanically isolated from conductor 10. Such an arrangement is desirable for aiding in maintaining a relatively low-energy test circuit isolated from a conductor 10 subject to high energy, in order to aid in protecting the components of the test current generator 612. So long as the configuration of the test current conductor generates the desired magnetic field in the vicinity of magnetic sensing device 20, there should be no difference in the magnetic sensing device performance relative to the arrangements of FIGS. 2a, 2b, 4a, 4b, 5a, and 5b. Control block 614 provides the same functions as control 514 of FIGS. 5a and 5b.

Figure 6B:
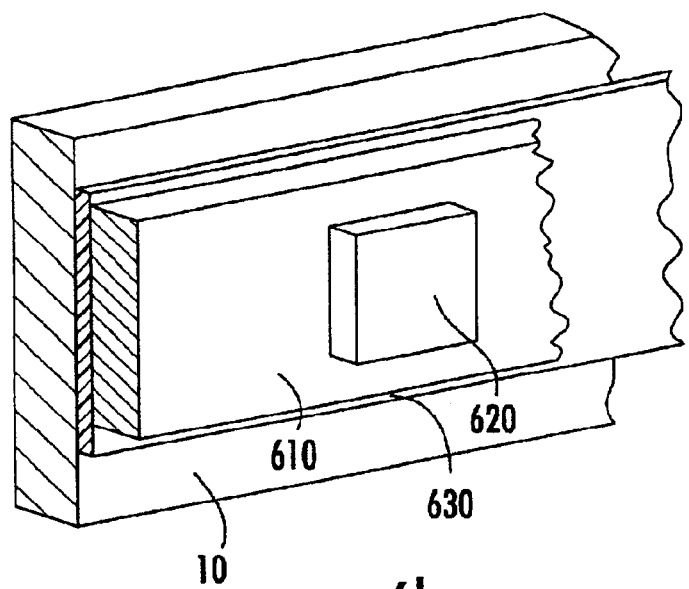
FIG. 6b illustrates an alternative version thereof.

FIG. 6b illustrates one physical configuration of the juxtaposed conductors which should be satisfactory. In FIG. 6b, both conductors 10 and 610 have the same generally flat configuration, and they lie adjacent each other with their flat sides juxtaposed, separated only by a sheet 630 of dielectric insulation. In FIG. 6b, the magnetic sensing device is illustrated as a flat rectangle 620, having its plane parallel to that of the generally planar conductors 10 and 610. However, if the magnetic sensing device 620 is sufficiently small relative to the other structures, the terms "lateral" and "orthogonal" become less important, as the sensor can simply be repositioned to sense the magnetic field.

Figure 7A:
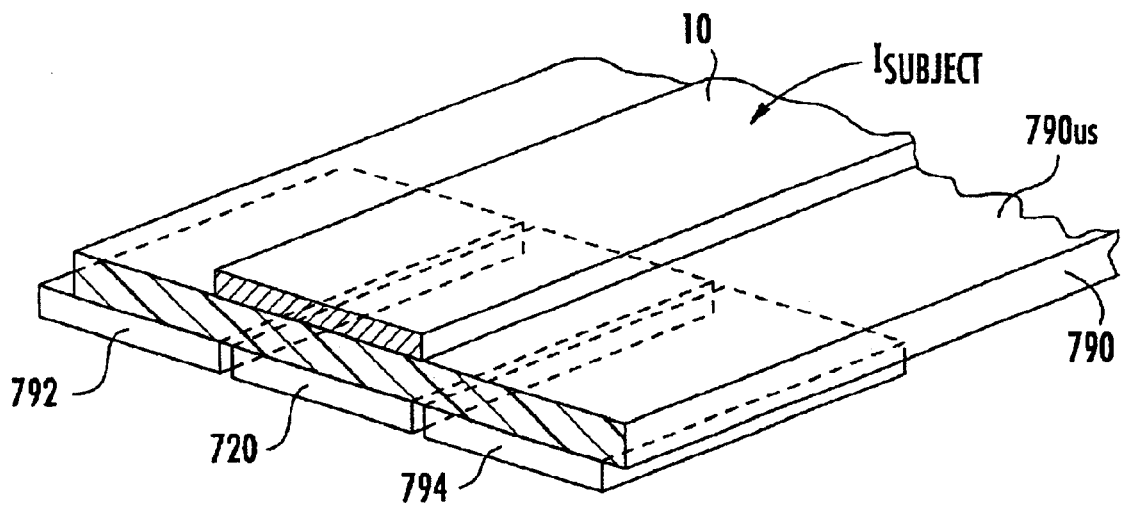
FIGS. 7a and 7b are simplified perspective and cross-sectional views of a current sensor arrangement which is arranged for printed-circuit type fabrication, and which uses field concentrators.
Figure 7B:
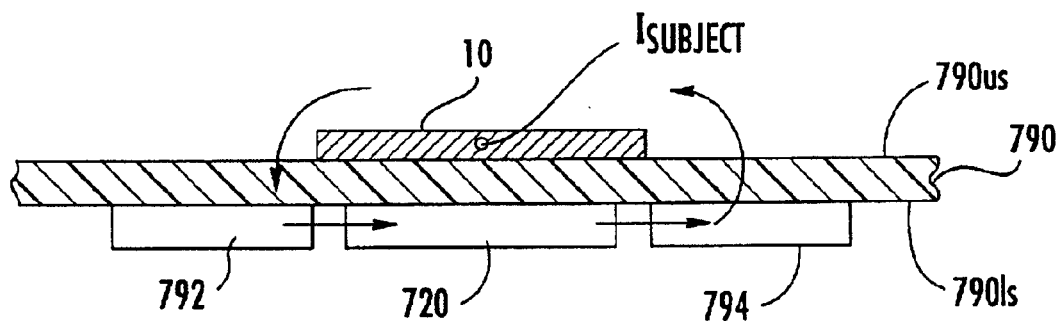

FIG. 7a is a simplified perspective or isometric view of a printed-circuit board embodiment of an aspect of the invention, which uses flux concentrators in the region of the magnetic sensing device, and FIG. 7b is a cross-section thereof in the region of the magnetic sensing device. In FIGS. 7a and 7b, $I_{subject}$ flows in elongated flat or planar conductor 10, which lies on the upper surface 790us of a dielectric slab or plate 790. The integrated-circuit magnetic sensing device is designated as 720, and lies against the lower surface 790ls of the dielectric plate 790. In this embodiment, the magnetic sensing device 720 is a lateral device, subject to the proviso that if it is small, the type is essentially irrelevant. A pair of generally flat magnetically permeable flux concentrator plates 792, 794 lie against the lower surface 790ls of the dielectric plate, with their planes aligned with the plane of the magnetic sensing device 720. The flux concentrator plates may be viewed as "scavenging" magnetic field lines which would tend to bypass the magnetic sensing device 720, or flowing through the sensor element at an undesirable angle, and causing those field lines to tend to pass through the sensor parallel with the plane of the sensor, thereby tending to increase the sensitivity of the sensor in the application.

Printed-circuit embodiments of the invention are very desirable for applications in which the currents are moderate, because the physical structure of the conductor 10 and test current conductors, if used, and their locations relative to each other and to the magnetic sensing device, can be controlled. Thus, experimentation can be used to determine the optimum locations of the various elements, so as to obtain the desired ratio of test flux to subject flux at the magnetic sensing device.

Figure 8:
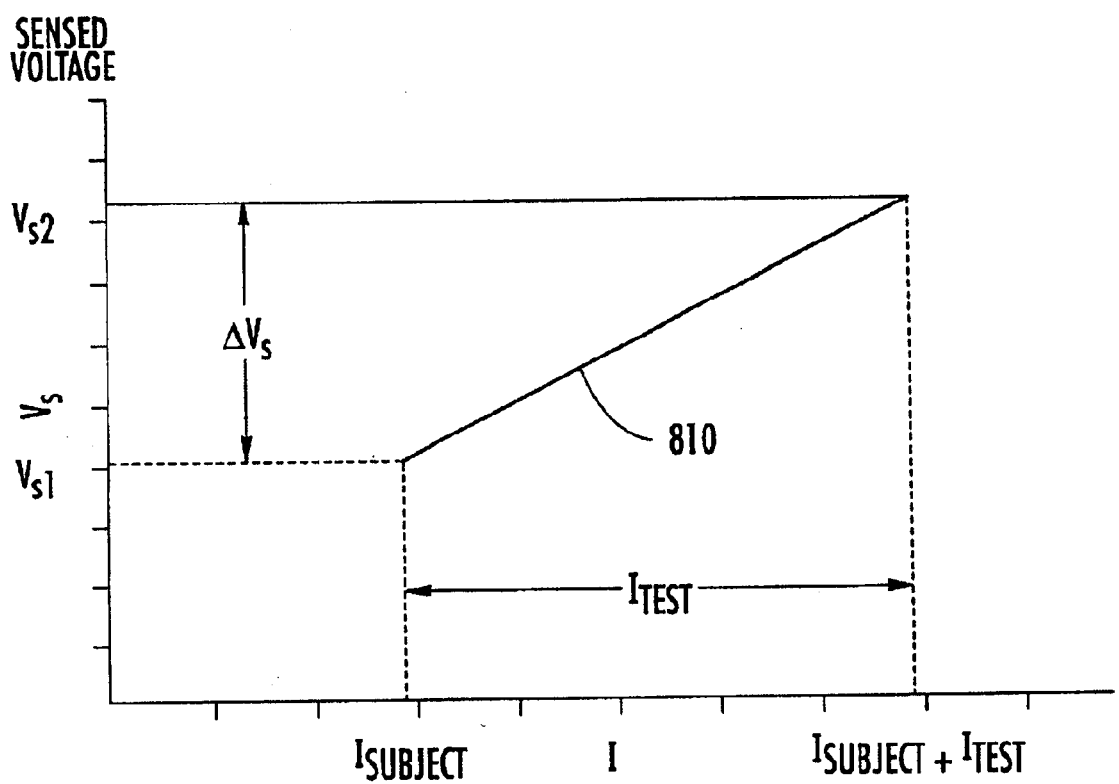
FIG. 8 is a diagram of sensed output voltage versus the sum of the currents in the spatial region of a GMR magnetic field sensor.

FIG. 8 illustrates the relationship of the sensed voltage of a magnetic sensing device relative to the sum of the subject current and the test current for a particular physical layout. In FIG. 8, the voltage $V_{s1}$ results from a magnetic field resulting from an arbitrarily selected value of $I_{subject}$. For various values of $I_{test}$ which cause a magnetic field component which sums with the magnetic field component caused by the subject current, the total sensed voltage rises along a line designated 810. Thus, at a test or bias current having a magnitude designated $I_{test}$ in FIG. 8 results in a sensed output voltage from the magnetic sensing device which is near $V_{s2}$, which represents an increase of $\Delta V_s$ from the base value of $V_{s1}$. The sensitivity S of the magnetic field sensor device can then be expressed as:

$$S = \frac{V_{S2} - V_{S1}}{I_{subject} + I_{test} - I_{subject}} = \frac{\Delta V_S}{I_{test}}$$

under all conditions of external and internal environment and noise.

In an embodiment of the invention for use in measuring alternating currents, the unipolar characteristic of some of the magnetic field sensor elements which can be used allows elimination of the absolute-value circuits which would otherwise be required. Those current sensor arrangements according to the various aspects of the invention which are made with printed-circuit or other bulk processing methods, a opposed to individual assembly/alignment of various elements, may provide both a cost advantage and the ability to maintain the dimensions of the various conductors, spacings, and magnetic relationships so that a very consistent current sensor arrangement can be fabricated from unit to unit.

The processing of the data according to certain aspects of the invention allows use of devices which are inconsistent in performance from unit to unit and under various temperature or other conditions. The general term which is used hereinafter to refer to such a current sensor is "corrected" current sensor.

Figure 9:
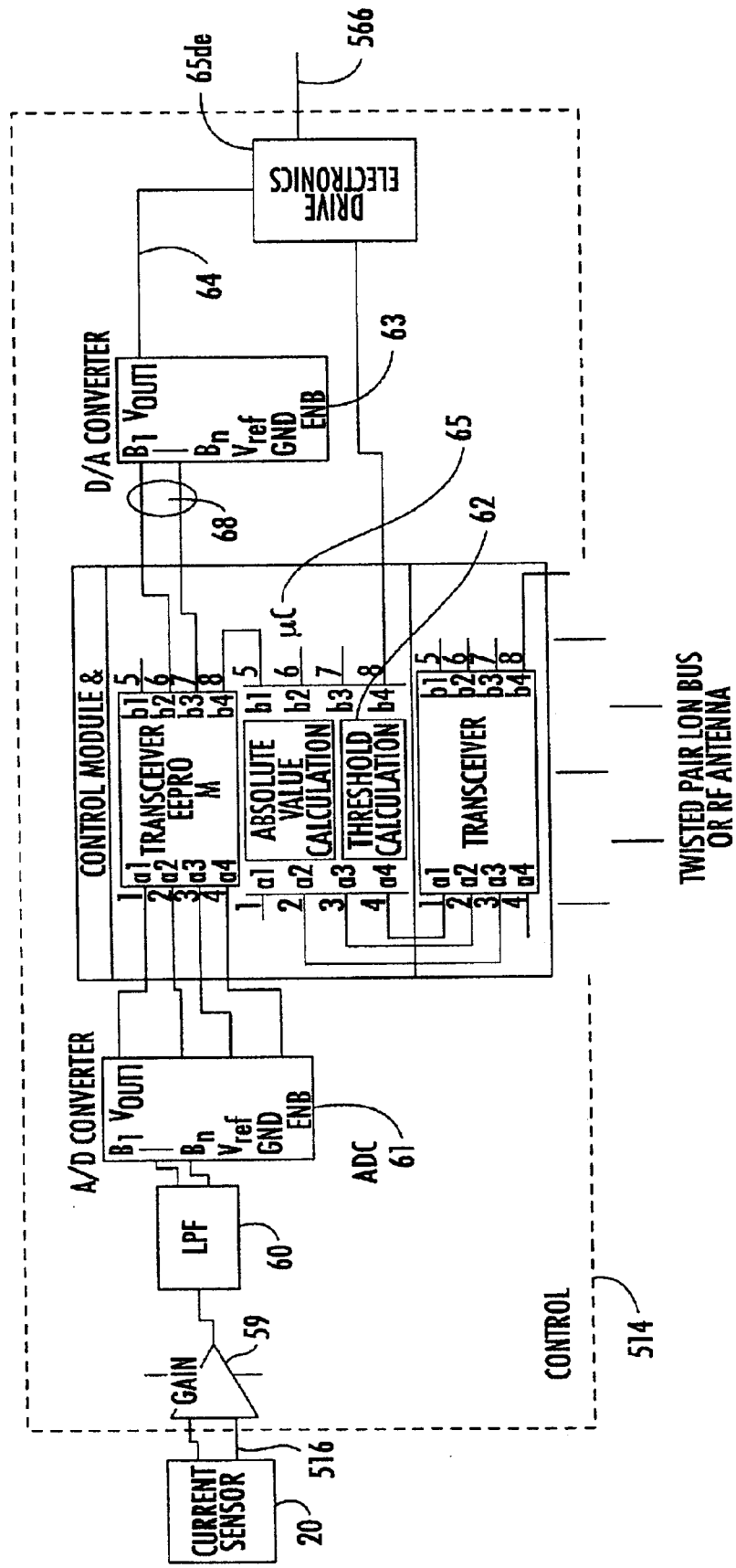
FIG. 9 is a simplified diagram in block and schematic form of a controller as described by Berkcan & Hoyle.

FIG. 9 is a simplified diagram in block and schematic form, illustrating some details of a controller 514 of FIGS. 5a, 5b, or 6. In FIG. 9, the magnetic-field-representative voltage produced by sensor 20 is applied by way of conductor set 516 to an amplifier or gain element 59 of control 514. The amplified signal is filtered in a filter 60 for noise reduction and applied to an analog-to-digital converter (ADC) 61 for conversion into digital form. The digital signals representing the magnetic field are applied to microprocessor ($\mu C$) 65 including absolute-value and threshold calculations illustrated as 62. The microprocessor also includes information stored in memory, such as an EEPROM, which define the test current to be generated. The test current defining digital signals are applied by way of a path 68 to a digital-to-analog converter (DAC) 63 which generates an analog signal representing the test or calibration current. The analog signal is applied from DAC 63 to drive electronics, illustrated as a block 65de, which generates the test current directly or which produces a control signal on conductor 566 for application to current source 414 of FIG. 5b or test current generator 612 of FIG. 6a.

As so far described, the magnetically coupled corrected current sensing device or apparatus of at least FIGS. 6a and 6b should, in principle, be adequate for use with large currents, unless the large currents flow on a printed-circuit board and exceed its current capability. It certainly seems a simple matter to juxtapose the low-current portions of the structure of FIGS. 6a and 6b, for example, with a large discrete or separate conductor, to thereby sample the magnetic field of the large conductor. It has been found, however, that the matter is more difficult than it might seem.

Figure 10A:
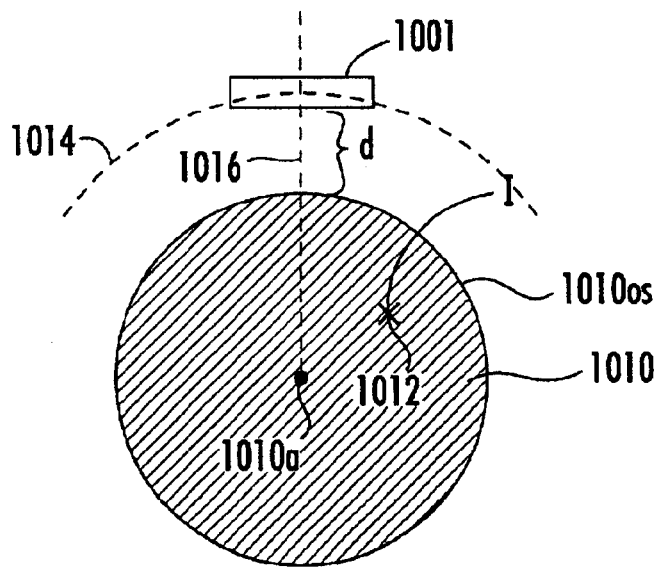
FIG. 10a is a simplified cross-sectional representation of a large conductor and a magnetically coupled current sensor at a given location.

FIG. 10a is a simplified cross-sectional view of a large-diameter electrical conductor 1010 having a circular cross-section, showing the "tail" of an arrow 1012 illustrating the direction of conventional current flow I. A portion 1014 of a magnetic field line is illustrated. It will be understood that magnetic field line portion 1014 is associated with only one of an infinite number of such magnetic field lines which surround the conductor 1010, and that the strength or intensity of the field lines decreases as the field lines occupy positions more remote from the conductor 1010. In FIG. 10a, the magnetically coupled current sensor or magnetic field sensor is designated by the numeral 1001, and it has a generally planar structure which is placed tangent to portion 1014 of the magnetic field line, astride or "centered" on a radius or radial line 1016, at a distance d from the outer surface 1010os of the conductor 1010. The tangential positioning is intended to maximize the response of the magnetic field sensor or current sensor 1001. Clearly, the ideal location for the current sensor 1001 would be immediately adjacent the outer surface 1010os of conductor 1010, so as to intercept the strongest magnetic field for maximum sensitivity, but the presence of dielectric insulation (not illustrated) or other design limitations, such as a noncontacting requirement, may require that the sensor 1001 be at a distance from the outer surface of conductor 1010, as illustrated in FIG. 10a.

Figure 10B:
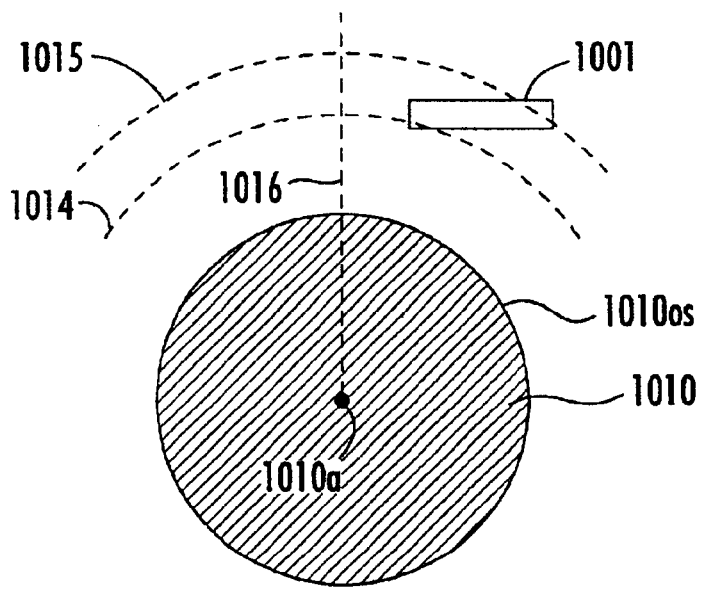
FIG. 10b illustrates a possible alternative location.

FIG. 10b illustrates a cross-section similar to that of FIG. 10a, but in which the sensor is offset from the radius 1016, and is therefore not at the same distance d from the outer surface 1010os of the conductor 1010 as in FIG. 10a. At the illustrated location in FIG. 10b, the sensor 1001 intercepts a less intense magnetic field 1015 than the magnetic field 1014 which it intercepts at the distance d shown in FIG. 10a. As the offset of the sensor 1001 from the radius line 1016 increases, the apparent sensed current will decrease. It is thus imperative that the sensor 1001 be "centered" or placed exactly in the desired location, or the current through the conductor 1010 may not be correctly measured or sensed. Unlike the low-current situation in which a printed circuit board can bear both the magnetic sensor, the test or correction loop, and the main current conductor, the measurement or sensing of large currents requires mechanical exactitude for the placement of each current sensor relative to its associated main conductor. Such installation requirements add to the time of installation and to the cost, and may result in nonobvious operating problems related to incorrect initial placement, or to movement of the sensor after installation.

According to another objectification of the invention, two current sensors are used to measure or sense the current in a large conductor. The two current sensors are placed in a common plane which is orthogonal to the radius line, and have a fixed spatial separation distance suited to the desired sensitivity and operating range. An advantage of this arrangement is that the fixed separation distance can be readily achieved by using one printed circuit board for support of both of the current sensors. The only remaining requirement is that the printed circuit board be mounted orthogonal to the radius line, without regard to the transverse positioning of the printed-circuit board relative to the radius. This has the advantage that, while transverse mounting error, which is to say offset of the printed-circuit board laterally of the radius line, has the effect of decreasing the apparent alternating current sensed by one of the two sensors, it also has the effect of increasing the apparent current sensed by the other of the sensors. Thus, one sensor of the pair is in a stronger magnetic field, and the other in a weaker magnetic field, so the current represented by the signal of that one of the sensor pair in the smaller magnetic field must be subtracted from the greater signal to get the correct value of current-representative signal. If the sensors were sensitive to magnetic field polarity, which they are not, the sensed signals would alternate in polarity during the two halves of an alternating-current cycle, and a simple summing would suffice. However, since the sensors sense the absolute value of the magnetic field, they effectively rectify the sensed signal or current, so the appropriate summing must be a subtraction rather than an addition in order to achieve the desired result. Consequently, it is only necessary to sum the apparent currents measured with a polarization established by the polarization sensitivity or lack thereof of the two sensors in order to make a determination of the actual alternating current in the large conductor.

FIG. 11a is a simplified representation of the conductor 1010 with the current sensor 1001 mounted at a location offset in a transverse direction from the radius line 1016. In general, the sensor 1001 is similar to sensor 600 of FIG. 6a, except in that the main current conducting path is large conductor 1010 rather than simple conductor 10. FIG. 11b is a representation of the response of the sensor of FIG. 11a to an alternating current flow in the conductor 1010. Basically, the waveforms of FIG. 11b represents the absolute value of an offset sine wave, in which each "half-cycle" of waveform is merely a continuation of the waveforms on either side. In particular, waveform 1102 is a continuation of waveform 1101, and waveform 1103 is a continuation of waveform 1102. As can be seen in FIG. 11b, the first half-cycle 1101 of current, and all odd-numbered succeeding half-cycles 1103, 1105, . . . of the alternating current, result in relatively low sensor response relative to the response to even-numbered half-cycles 1102, 1104, . . . for this first orientation or location of the sensor. FIG. 11c is a simplified representation of the conductor 1010 with the magnetically coupled current sensor 1001 mounted at a location offset in the opposite transverse direction, by comparison with FIG. 11a, while FIG. 11d is a representation of the response of the sensor of FIG. 11c to the same alternating current. As can be seen in FIG. 11d, the first half-cycle 1101 of current, and all odd-numbered succeeding half-cycles 1103, 1105, . . . of the alternating current, result in relatively large sensor response relative to the response to even-numbered half-cycles 1102, 1104, . . . for this second orientation or location of the sensor.

FIG. 12b illustrates the summed responses of two sensors, designated 1001 and 1002, mounted relative to conductor 1010 at the locations illustrated in FIGS. 11a and 11c. FIG. 2a illustrates the locations of sensors 1001 and 1002. As illustrated in FIG. 12b, the summed response is equal from one half-cycle to the next. As mentioned, the summing takes the form of subtraction when the magnetic sensors sense the absolute value of the magnetic field. It turns out that the waveform of FIG. 12b is the same waveform as produced by a single sensor 1001 of FIG. 10a placed at appropriately the correct location.

As mentioned, because of the presence of conductor insulation and other mounting limitations, it may be difficult or expensive to mount a single sensor in the precise location that provides maximum response. Two sensors such as those depicted in FIG. 12a can be mounted on a single printed-circuit board, with a fixed or known distance between the sensor elements, and with the sensing axes of the sensors precisely parallel, as illustrated in FIG. 13, to form a current sensor or double current sensor 1300. The accuracy or precision in holding the two sensors precisely parallel and at a fixed distance from each other can be readily achieved with printed-circuit-board techniques. In FIG. 13, a printed circuit board 1310 of sensor 1300 defines a plurality of mounting holes or apertures, some of which are designated 1314. Board 1310 also includes a region 1001 in which all the conductors appropriate to a magnetically coupled or corrected current sensor, such as those described in conjunction with FIG. 6a, are located, with the exception of the main current carrying path, which as mentioned is the main current carrying path 1010. The arrow 1301 indicates the direction of the preferred sensing axis of the corrected current sensor (or a noncorrected sensor, if used). In addition, printed circuit board 1310 includes a further region 1002 in which all the conductors associated with another such corrected current sensor are located. The arrow 1302 indicates that the preferred sensing axis of this corrected current sensor is parallel with that of the first magnetically coupled or corrected current sensor 1001.

A know spacing S separates the active or magnetically sensitive portions of region 1001 and 1002. The error-correcting or error-offsetting capability of a sensor arrangement according to one version of the invention increases as the separation between sensors increases, and decreases as they are brought together. Thus, two sensors placed side-by-side can be viewed as a single large sensor, and its placement could be subject to the same errors as a single sensor. The separation of the sensors 1001 and 1002 results in the definition of a sensor plane parallel with the xy plane of FIG. 13.

All that is necessary, in order to be able to sense the current in the large conductor, is to mount the printed-circuit 1310 board, bearing the two sensors, orthogonal to the radial line 1016, as illustrated in the cross-section of FIG. 14, and parallel with a plane 1010t tangent to the outer surface 1010os of the conductor 1010. As suggested by the double-headed arrow 1410 in FIG. 14, the sensitivity of the dual-sensor arrangement or printed circuit board 1310 is not significantly affected by a certain amount of transverse mounting error.

Figures 15A, 15B:
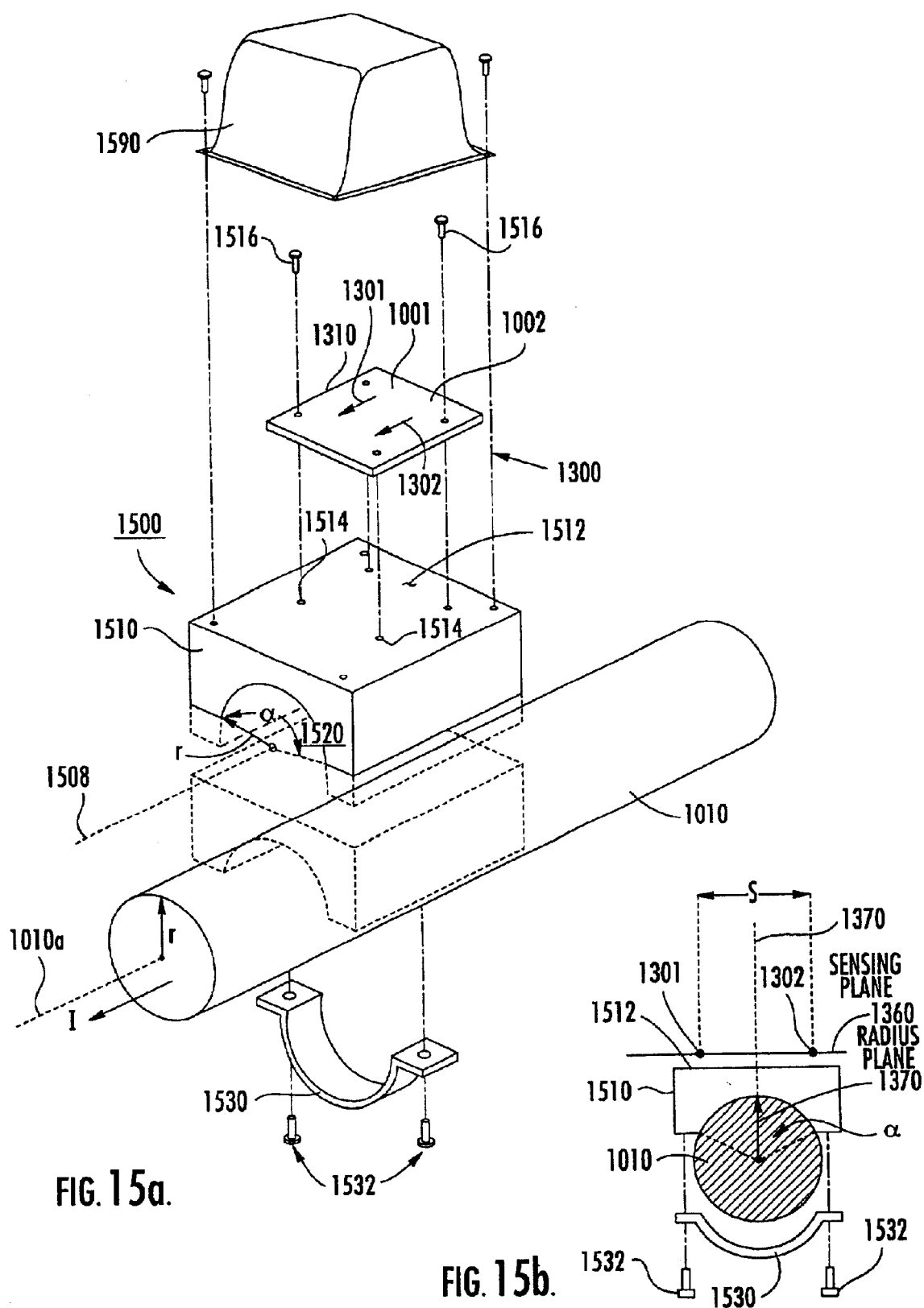
FIG. 15a is a simplified, exploded view of a current sensor according to an aspect of the invention, showing how the various parts fit together.
FIG. 15b is a conceptual cross-section of the structure of FIG. 15a, partially assembled, to show details.

According to another aspect of the invention, the current sensor or double current sensor 1300 is provided with a mounting arrangement which includes a cylindrical partial cavity dimensioned to accommodate the particular current-carrying conductor and to mount the sensor at the appropriate position. FIG. 15a illustrates, in exploded view, a sensor board 1300, a cylindrical current-carrying conductor 1010, a mounting arrangement 1500 adapted to fit that particular conductor and the sensor board, and a cover 1590 for the electrical or electronic portions of the apparatus. In FIG. 15a, the conductor 1010 is right-cylindrical and has a radius of r. The mounting arrangement 1500 includes a body 1510 defining a flat sensor board mounting surface 1512. One or more threaded screw apertures 1514 are provided in surface 1512 for accommodating sensor board 1310 hold-down screws 1516. Body 1510 also defines a cylindrical depression or aperture 1520 defining a longitudinal axis 1508. The longitudinal axis 1508 is parallel with the flat mounting surface 1514. Cylindrical depression or aperture 1520 defines a radius r, equal to, or possibly slightly larger than, the corresponding radius r of the cylindrical conductor. As illustrated, the depression 1520 subtends an angle of less than 180° of a circle, to make it easier to fit the body 1510 onto the conductor 1010 when the radii r are close in size. The mounting holes 1314 in board 1310 and 1514 in body 1510 are positioned so that, when the mounting holes in the board and in the body are registered, the sensing axes 1301 and 1302 of board 1310 are parallel with axis 1508 of aperture 1520, to thereby guarantee, to the extent possible, that the sensing axes 1301 and 1302 are parallel with the direction I of electrical current conduction in the conductor 1010, and that the plane of the printed circuit board bearing corrected current sensors 1001 and 1002 is orthogonal to a radius of the conductor 1010.

FIG. 15b is a cross-sectional view of an embodiment of the invention similar to that of FIG. 15a, illustrating how the mounting arrangement 1510 is held to the conductor 1010. In FIG. 15b, a simple clamp 1530 dimensioned to fit the curvature of conductor 1010 is affixed by means of screws designated as 1532 to the underside of body 1510. As an alternative, the body 1510 could be adhesively affixed to the conductor to aid in preventing relative movement. FIG. 15b also illustrates the spacing S between sensing axes 1301 and 1302, and the plane 1360 defined by the sensing axes. Plane 1360 is preferably located orthogonal to a plane which contains a plurality of radii, which in FIG. 15b is plane 1370.

Figure 16:
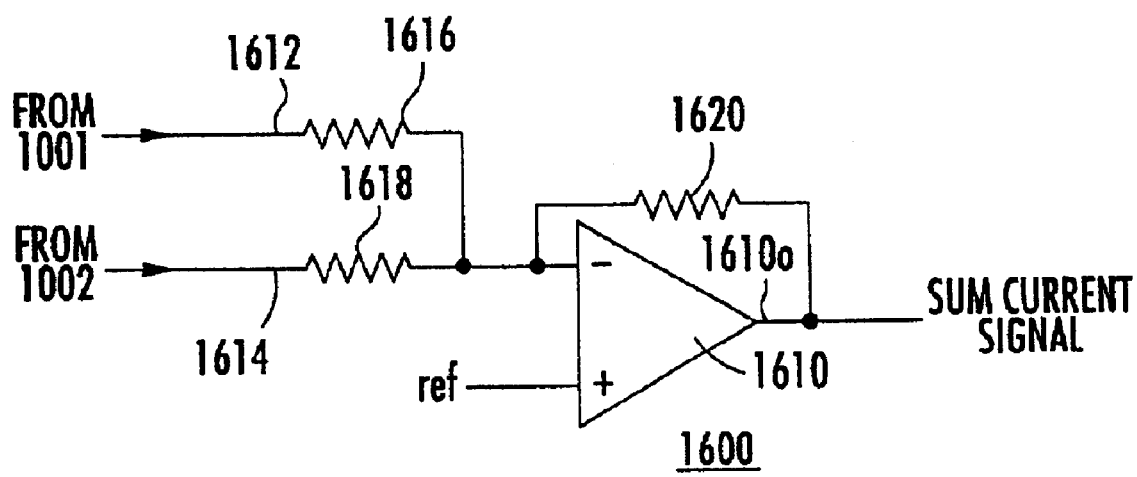
FIG. 16 is a simplified schematic or block diagram of a summing circuit which may, in accordance with an aspect of the invention, be used in conjunction with pairs of current sensors.

According to a further aspect of the invention, a summing arrangement is coupled to the corrected current sensors 1001 and 1002, for receiving the signals produced by the corrected current sensors, and for summing the currents represented by the signals, so as to produce a signal indicative of the actual current flowing in the circuit. FIG. 16 is a simplified block diagram of a processor for performing the processing for combining the currents represented by the signals produced by corrected current sensors 1001 and 1002. The circuits represented by FIG. 16 can be mounted on the printed-circuit board 1310 at a location lying between the two corrected current sensors 1001 and 1002, or can be mounted off-board at a remote location, as desired. In FIG. 16, a summing circuit 1600 includes an operational amplifier 1610 including inverting (−) and noninverting (+) input terminals. A first signal path 1612 is connected to the output of corrected current sensor 1001 for receiving therefrom signal voltage representing the current sensed by corrected current sensor 1001. A second signal path 1614 is coupled to the output of corrected current sensor 1002 for receiving therefrom signal voltage representing the current sensed by sensor 1002. Paths 1612 and 1614 are coupled to the inverting (−) input terminal of amplifier 1610 by way of resistors 1616 and 1618, respectively. Negative or degenerate feedback is provided from the output terminal 1610o of amplifier 1610 to the inverting input terminal either by way of a simple conductor, or by way of a resistor 1620 as illustrated in FIG. 16 if scaling or amplification of the current-representative signal is desired. The noninverting (+) input terminal of amplifier 1610 is connected to a reference potential, as known to those skilled in the circuit arts. Other ways to process the signal are possible, and include the digitizing of the two signals from sensors 1001 and 1002, followed by digital summing of the signals represented thereby. As mentioned, this summing may be in the form of subtraction.

Figure 17:
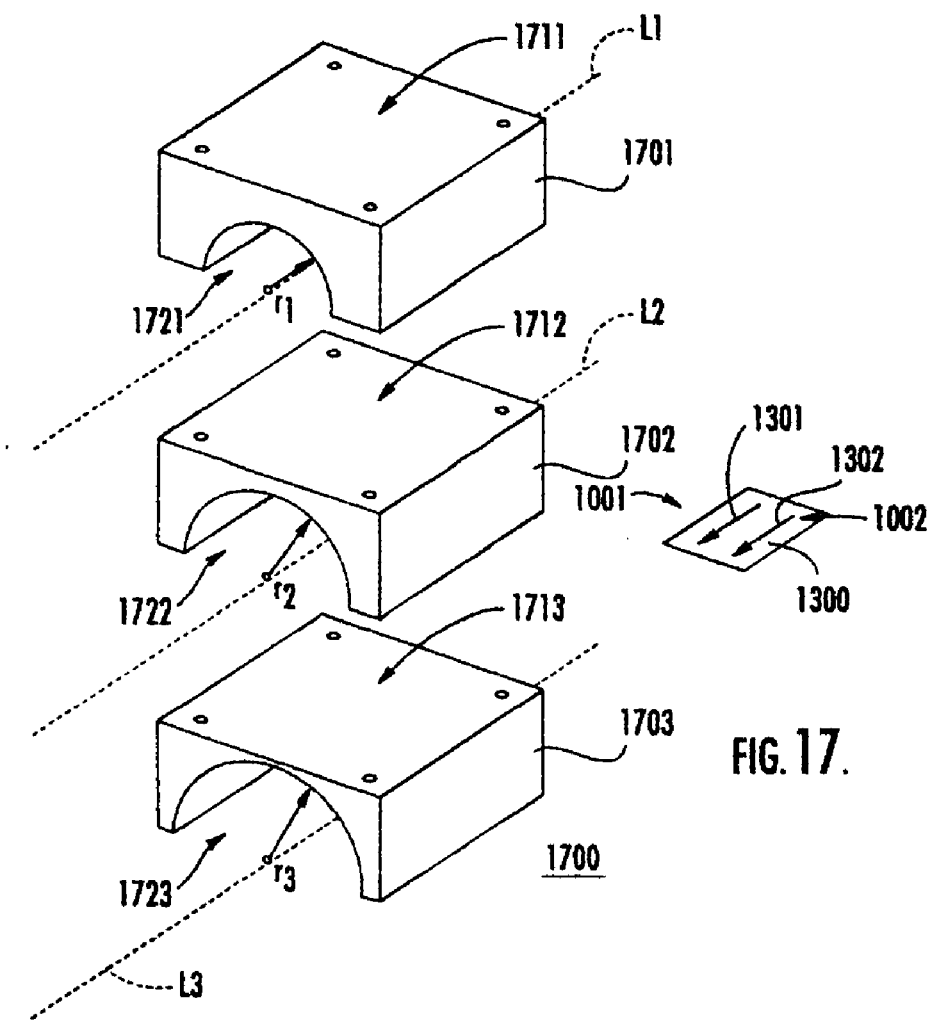
FIG. 17 is a simplified perspective or isometric view of a kit of parts including a current sensor arrangement together with a plurality of differently sized bodies which may be used to mount the current sensor on any of a number of different sizes of conductors.

FIG. 17 illustrates a kit or group of differently dimensioned bodies 1701, 1702, and 1703, each of which is similar to body 1510 of FIG. 15a, but which have their cylindrical cavities or depressions of various sizes, to accommodate different conductor sizes. For example, the cavity 1721 of body 1701 is shown as having a radius r1, cavity 1722 of body 1702 is shown as having a larger radius r2, and cavity 1723 of body 1703 is shown as having the largest radius r3. These would accommodate conductors having radii r1, r2, and r3, respectively. While the cavities are shown as being cylindrical, they may be of other generally rounded cross-sections, such as hexagons, octagons, or other polygons, to like effect. Each of the bodies 1701, 1702, and 1703 has a current sensor board mounting arrangement, designated generally as 1711, 1712, and 1713, respectively, for mounting corrected current sensor pair arrangements such as 1300 of FIG. 15a, with their sensing axes parallel with the direction of current in the associated conductors.

Figure 18A:
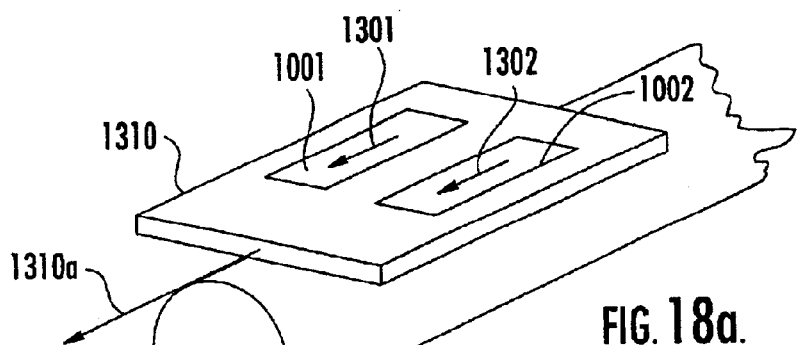
FIG. 18a is a perspective or isometric view, which illustrates a printed-circuit board mounting for two corrected current sensors, and its proper orientation to a large current-carrying conductor.
Figure 18B:
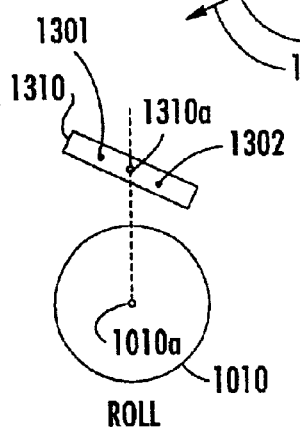
FIG. 18b is an axial view of the structure of FIG. 18a, showing roll positional error of the printed-circuit board.
Figure 18C:
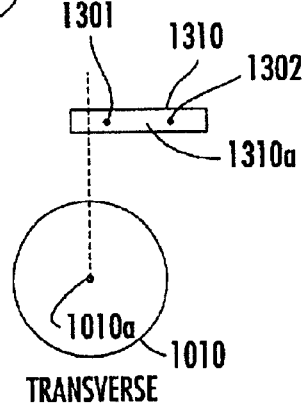
FIG. 18c is a similar axial view showing transverse error.
Figure 18D:
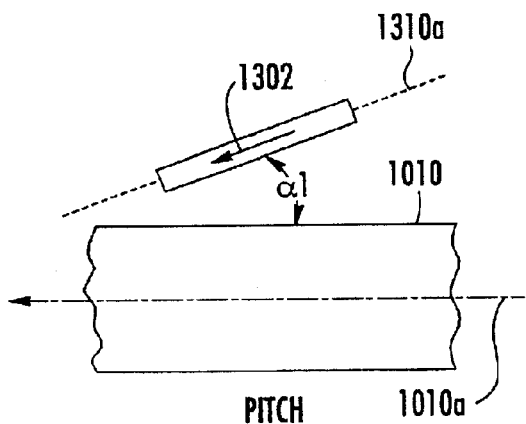
FIG. 18d is a side view of the structure of FIG. 18a with an illustration which represents pitch error.
Figure 18E:
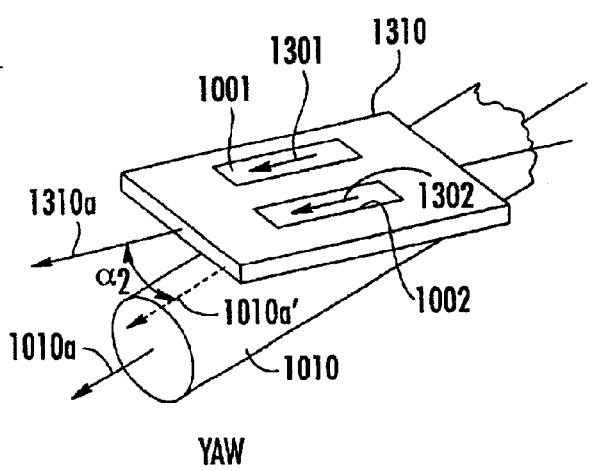
FIG. 18e is a perspective or isometric view of the structure of FIG. 18a, illustrating yaw error.

A purpose of certain aspects of the invention is to allow for simple and low-cost installation and maintenance of relatively inexpensive current sensors, without requiring highly accurate installation tolerances. FIG. 18a is a perspective or isometric view of a portion of a current-carrying conductor, together with a printed-circuit board 1310 carrying current sensors 1001 and 1002, having preferred sensing axes 1301 and 1302, respectively. FIG. 18b illustrates an end view of the structure of FIG. 18a, showing a misplacement of the printed-circuit board relative to the conductor which may, by analogy to the posture of a vehicle, be termed "roll" about the axis 1310a of the printed-circuit board. FIG. 18c illustrates the lateral offset toward the compensation of which some of the embodiments of the invention are directed. FIG. 18d illustrates "pitch" of the board 1310 relative to the conductor, in which there is a pitch angle $\alpha_1$ between axes 1010a and 1310a, and FIG. 18e illustrates "yaw," in which there is a skew axis $\alpha_2$ between axes 1010a and 1310a. As mentioned, the embodiments of the invention associated with the aspect for compensation of the effects of transverse error tend to ameliorate those effects. The roll and pitch errors of FIGS. 18b and 18d, respectively, are not believed to result in much current measurement error, so long as a mounting block arrangement such as that of FIGS. 15a, 15b, or 17 is used to align the magnetic sensors 1001, 1002 (or noncorrected sensors such as 20 of FIG. 2a or 620 of FIG. 6b) to the conductor. It should be noted that the length of board 1300 of FIG. 13 and the attendant mounting blocks 1500, 1700 of FIGS. 15 and 17, respectively, are very much greater than the length of the actual sensors 1001 and 1002. This aids in achieving one of the purposes of the mounting arrangement, which is to preclude or minimize the roll and pitch errors. Basically the geometry of 1300/1701 precludes 1001/1002 from being rolled or pitched. In addition to the above-described errors, there is one other error, which is the z-direction of heave error; again the mounting system pretty much prevents that error. The yaw error $\alpha_2$ illustrated in FIG. 18e, on the other hand, whether associated with a single sensor or a sensor pair, may cause substantial error in the sensed signal relative to that which should be measured. In general, this is because the preferred magnetic field sensing axis is not parallel (or perpendicular, as the case may be) with the magnetic field lines. If the error were to be 45°, for example, the sensor (or sensors if there are two) would respond with an indication of only 0.707 of the actual value of field or indicated current. It is believed that the accuracies available from printed-circuit mountings and conductor-engaging blocks may not be sufficient for effective use in the presence of yaw placement errors.

According to another aspect of the invention, correction is provided for yaw-type inaccuracy in magnetic sensor placement. FIG. 18a is a perspective or isometric view, which illustrates a printed-circuit board mounting for two corrected current sensors, and its proper orientation to a large current-carrying conductor, FIG. 18b is an axial view of the structure of FIG. 18a, showing roll positional error of the printed-circuit board, FIG. 18c is a similar axial view showing transverse error, the compensation of which is described above, FIG. 18d is a side view of the structure of FIG. 18a with an illustration which represents pitch error, and FIG. 18e is a perspective or isometric view of the structure of FIG. 18a, illustrating yaw error $\alpha_2$ between axis 1310a and the projection 1010a' of conductor axis 1010a into the plane of support 1310. It will readily be recognized that the type of misalignment illustrated in FIG. 18e results in a sensed signal from either of the sensors 1001 or 1002 which is reduced in magnitude by the cosine of the angle $\alpha_2$ relative to that which would occur with 0° error. To a first approximation, angle $\alpha_2$ may be taken to be equal to its projection into the horizontal plane. The problem of error of the sensed signal relative to the actual current due to yaw of the sensors relative to the conductor is corrected, according to an aspect of the invention, by mounting two magnetic sensors with their preferred magnetic sensing axes mutually orthogonal, as illustrated in FIG. 19a.

Figure 19B:
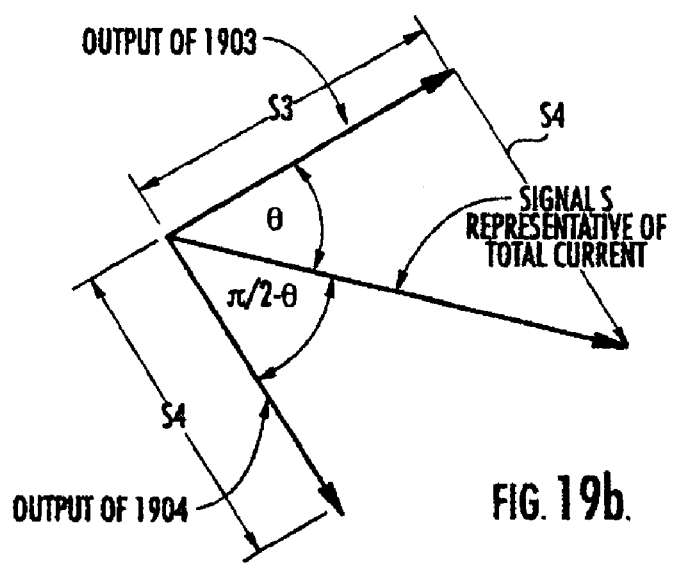
Figure 19A:
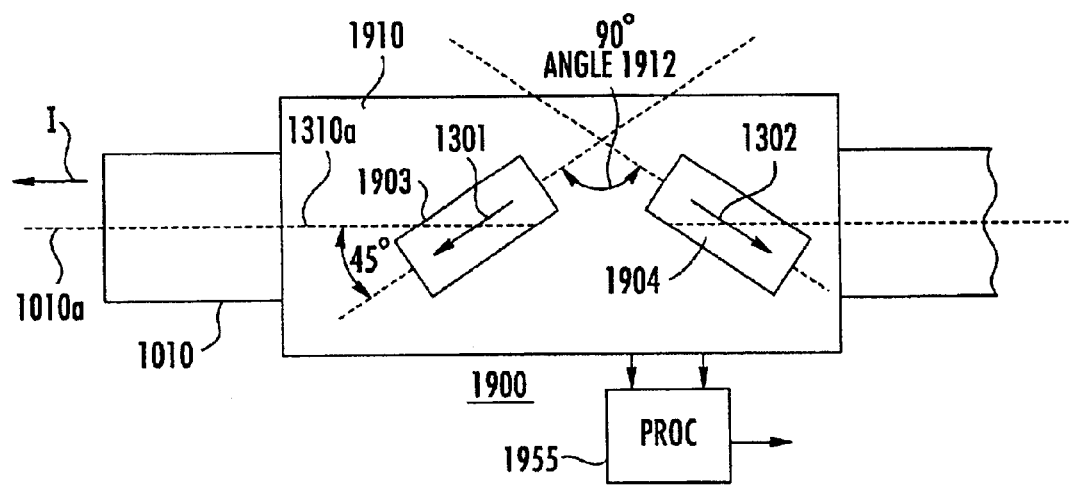
FIG. 19a is a simplified plan view of a current sensor mounting arrangement associated with a current-carrying conductor, with the current sensors of the mounting arrangement mutually orthogonal to define a sensor plane, and in which the sensor plane is parallel to a tangent to the surface of the conductor.

In FIG. 19a, printed-circuit board 1910 bears corrected current sensors 1903 and 1904, but unlike the arrangements described above, the preferred sensing axes 1301 and 1302 are placed mutually orthogonal, as indicated by right-angle or 90° symbol 1912. In the embodiment of FIG. 19a, both preferred sensing axes 1301 and 1302 make 45° with the axis 1010a of conductor 1010. This orientation results in substantially equal sensed signal from each sensor 1903 and 1904, as illustrated by S3 and S4 in FIG. 19b. Other angles may be used, but with the result that the sensed signals from the two sensors will have substantially different values, which may introduce errors during processing of the signals. With the orientation of the sensors as illustrated in FIG. 19a, each sensor 1903 and 1904 responds with a signal which is the product of the "proper" or maximum response multiplied by the cosine of 45°, which is 0.707. Thus, the 45° orientation of FIG. 19a results in reduction of the maximum signal by a factor of 0.707. The total current is determined from signal components S3 and S4 illustrated in FIG. 19b, representing the ideal outputs of sensors 1301 and 1302 of FIG. 19a. The magnitude of total magnetic field S is proportional to the current, and is given by $$\sqrt{|S3|^2+|S4|^2}=\sqrt{S^2\sin^2(\Theta)+S^2\cos^2(\Theta)}=S,$$

where $\Theta$ is the angle between signal component S3 and total S. A block illustrated as 1955 in FIG. 19a may do the processing. An error in yaw placement produces an incremental sensor error which is additive in one sensor and subtractive in the other sensor.

Figure 20:
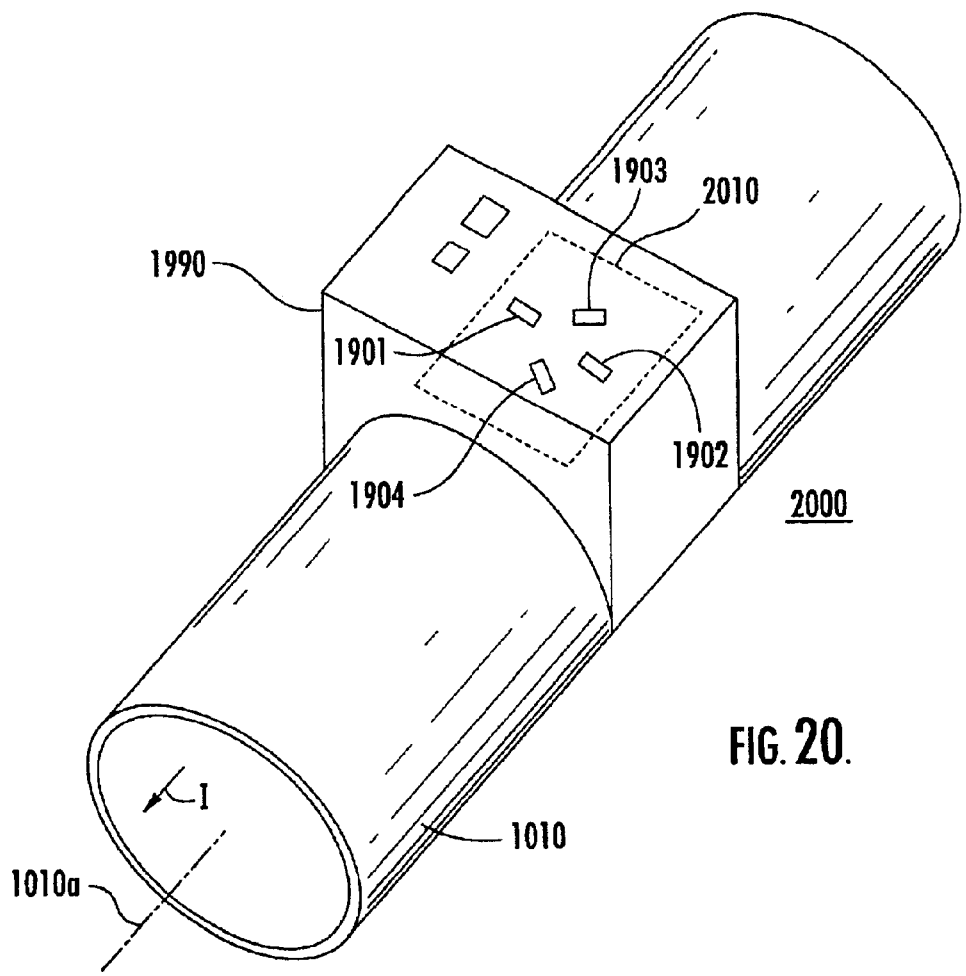
FIG. 20 is a simplified perspective or isometric view of a current-carrying conductor together with a mounting arrangement for four current sensors in two sets, one set having parallel preferred sensing axes, the other having orthogonal preferred sensing axes.

In FIG. 20, the current-carrying conductor is designated 1010, and the printed-circuit board carrying the magnetic current sensors (or corrected sensors, as appropriate) is designated 2010. A lid 1990 covers the printed circuit board. As illustrated, support or board 2010 bears four current sensors 1901, 1902, 1903, and 1904. Current sensors 1901 and 1902 correspond to current sensors 1301 and 1302 of FIGS. 13 or 15a, in that they have mutually parallel sensing axes, while current sensors 1903 and 1904 correspond to the sensors of FIG. 19, which have mutually orthogonal sensing axes. The operation of the sensor pairs is described above, and no additional discussion is necessary. The two processed signals from the sensor pairs are corrected to the same number.

Other embodiments of the invention will be apparent to those skilled in the art. For example, while the two sensors have been described as being mounted on a "printed circuit board," those skilled in the art know that any equivalent device for both holding the sensors and making connections thereto, such as a solid-state substrate, may be used.

An electrical current (I) sensor arrangement (1300, 1500, 1900, 2000) according to a general aspect of the invention is for sensing the current (I) in an elongated conductor (1010). The arrangement (1300, 1500, 1900, 2000) comprises first (1001; 1903) and second (1002; 1904) current (I) sensing devices which can be magnetically coupled to the current (I) to be sensed, for generating sensed signals relating to the magnitude of the current (I) being sensed. Each of the first (1001; 1903) and second (1002; 1904) current (I) sensing devices has a preferred magnetic sensing axis (1301, 1302), which in general is oriented relative to the current (I) flow in the conductor (1010) so as to provide a sensed signal. A nonmagnetic physical mounting (1310; 1310, 1510; 1910; 2010) is physically coupled to the first (1001; 1903) and second (1002; 1904) current sensors, for holding the first (1001; 1903) and second (1002; 1904) current sensors with their preferred sensing axes one of mutually (a) parallel and (b) orthogonal, thereby defining a sensor plane in which the current (I) sensing devices lie. The fact that the current sensing devices (1001, 1002; 1903, 1904) lie in the same plane (the upper surface of printed board 1310 or 1910) necessitates or requires a spacing (S) between the current sensing devices. The spacing (S) remains fixed. The physical mounting (1310; 1310, 1510; 1910; 2010) is adapted for mounting adjacent an electrical conductor (1010), with the sensor plane (xy) parallel with a tangent (1010t) with an outer surface (1010os) of the electrical conductor (1010), and for, when so mounted, holding the preferred sensing axes (1301, 1302) of the sensors relative to the direction of current (I) flow in the conductor (1010) so as to produce a sensed signal in at least one, and preferably both, of the current (I) sensing devices, in response to current (I) flow in the conductor (1010). As a result, each of the current (I) sensing devices (1001, 1002; 1903, 1904) senses magnetic fields related to less than the total current (I) flowing through the electrical conductor (1010), or at least gives an indication which is less than it would give if properly located and oriented. The arrangement (1300, 1500, 1900, 2000) includes electrical coupling means (1600; 1955) coupled to the first (1001; 1903) and second (1002; 1904) current (I) sensors, for processing the sensed signals produced by the first (1001; 1903) and second (1002; 1904) current (I) sensors, to thereby produce a signal representative of the total current (I) in the electrical conductor (1010). In one embodiment, the conductor (1010) has a generally circular cross-section. Other embodiments may have oval or polygonal cross-sections. Ideally, the current (I) sensors are corrected for at least one of (a) temperature effects and (b) unit-to-unit variation in sensitivity. In the version in which the sensing axes (1301, 1302) of the current (I) sensors are parallel, a transverse separation (S) of the sensors is desirable.

In one version of the arrangement according to an aspect of the invention, the electrical coupling means (1600; 1955) sums the currents represented by the signals generated by the first (1001; 1903) and second (1002; 1904) current (I) sensing devices to produce the signal representative of total current (I) in the electrical conductor (1010).

According to another aspect of the invention, the physical mounting (1310; 1310, 1510; 1910; 2010) comprises a first physical mounting (1310; 1310, 1910; 2010) portion physically coupled to the first (1001; 1903) and second (1002; 1904) current (I) sensors, for holding the first (1001; 1903) and second (1002; 1904) current (I) sensors with their preferred sensing axes (a) parallel or (b) mutually orthogonal, thereby defining a sensor plane (xy), and with a fixed or known spacing (S) between the preferred sensing axes or the sensors. According to this aspect of the invention, a second physical mounting (1510) portion is provided for mounting adjacent an electrical conductor (1010). The second physical mounting (1510) portion includes means (1512) for holding the first physical mounting (1310; 1310, 1910; 2010) portion with the sensor plane (xy) parallel with a tangent with (or to) (1010*t*) an outer surface (1010*os*) of the electrical conductor (1010), and for, when so mounted, holds the preferred sensing axes (1301, 1302) (a) generally parallel with the direction of current (I) flow in the electrical conductor (1010) or (b) at 45° to the direction of current (I) flow. It must be understood that the sensing axes are interpreted so as to result in the desired sensed signal. In one version of this aspect of the invention, the first physical mounting (1310; 1310, 1910; 2010) portion comprises a printed-circuit board, and the second physical mounting (1510) portion comprises a nonmagnetic structure including a printed circuit mounting portion (1512) defining a plane, and also including a depression (1520) shaped to the exterior of the conductor (1010). The depression (1520) defines a longitudinal axis (1508) parallel with the plane (xy) of the printed circuit mounting (1310; 1310, 1910; 2010) portion. In this regard, the plane may be identified, in some versions, by the plane common to a set of bosses (not illustrated) which, in use, bear on the underside of the printed-circuit board.

In a kit (1700) of nonmagnetic mounting arrangements (1701, 1702, . . . 1703) according to another avatar of the invention, each of the mounting arrangements (1701, 1702, . . . 1703) includes first and second body arrangements. The first body arrangement (1701) defines (a) a mounting location (1711) for a pair of current (I) sensors, each defining a preferred magnetic sensing axis (1301, 1302), for mounting the pair of current (I) sensors thereon with a specific or fixed distance between the current (I) sensors, and with the preferred sensing axes parallel so as to define a sensing plane;

(b) a circularly cylindrical cavity (1721) defining a longitudinal axis (L1) parallel with the preferred magnetic sensing axes of the current (I) sensors and also defining a first radius (r1), for mounting to a cylindrical electrical conductor (1010) having a radius substantially equal to the first radius (r1), the longitudinal axis (L1) of the cavity (1721) being parallel with the preferred sensing axes (1301, 1302), and the sensing plane (xy) orthogonal to a plane (1016) in which plural radii of the cavity (1721) lie.

The second body arrangement (1703) defines (a) a second mounting location (1713) for said (1002; 1904) pair of current (I) sensors, for mounting said pair of current (I) sensors thereon with the specific distance between the current (I) sensors of the second pair, and with the preferred sensing axes parallel so as to define a second sensing plane;

(b) a second circularly cylindrical cavity (1723) defining a second longitudinal axis (1010*a*) parallel with the preferred magnetic sensing axes of the second pair of current (I) sensors and also defining a second radius (r3), different from the first radius (r1), for mounting to a cylindrical electrical conductor (1010) having a radius substantially equal to the second radius (r3), the longitudinal axis (1010*a*) of the second cavity being parallel with the preferred sensing axes, and the second sensing plane orthogonal to a plane (1016) in which plural radii of the cavity lie.

Yet another embodiment of an avatar of the kit aspect of the invention lies in a kit of noncontacting magnetic sensors adapted for use with differing sizes of electrical conductor (1010)s, where the kit comprises a first body arrangement. The first body arrangement defines (a) a mounting location for a pair of current (I) sensors (which are preferably corrected current (I) sensors), each defining a preferred magnetic sensing axis (1301, 1302), for mounting the pair of current (I) sensors thereon with a specific distance between the current (I) sensors, and with the preferred sensing axes parallel so as to define a sensing plane;

(b) a circularly cylindrical cavity defining a longitudinal axis (1010*a*) parallel with the preferred magnetic sensing axes of the current (I) sensors and also defining a first radius, for mounting to a cylindrical electrical conductor (1010) having a radius substantially equal to the first radius, the longitudinal axis (1010*a*) of the cavity being parallel with the preferred magnetic sensing axes, and the sensing plane (xy) orthogonal to a plane (1016) in which plural radii of the cavity lie. This other embodiment also includes a second body arrangement, the second body arrangement defining (a) a second mounting location for a pair of current (I) sensors, each defining a preferred magnetic sensing axis (1301, 1302), for mounting the pair of current (I) sensors thereon with the specific distance between the corrected current (I) sensors of the pair, and with the preferred magnetic sensing axes parallel so as to define a second sensing plane;

(b) a second circularly cylindrical cavity defining a second longitudinal axis (1010*a*) parallel with the preferred magnetic sensing axes of the pair of corrected current (I) sensors and also defining a second radius different from the first radius, for mounting to a cylindrical electrical conductor (1010) having a radius substantially equal to the second radius, the longitudinal axis (1010*a*) of the second cavity being parallel with the preferred magnetic sensing axes, and the second sensing plane (xy) orthogonal to a plane (1016) in which plural radii of the cavity lie. The kit also includes a pair of magnetically coupled current (I) sensors (1001, 1002), each defining a preferred magnetic sensing axis (1301, 1302), with the pair of current (I) sensors being dimensioned for mounting to any one of the first (1711) and second (1713) mounting locations of the first (1701) and second (1703) body arrangements, respectively.

A method for noncontact measurement of the current (I) in a conductor (1010) according to another aspect of the invention includes the step of procuring two current (I) sensors, preferably of the corrected type, each defining a preferred magnetic sensing axis (1301, 1302). The current (I) sensors are held with the preferred magnetic sensing axes mutually parallel and spaced apart from each other to define a sensor plane, and to also define a second plane parallel to the preferred magnetic sensing axes and orthogonal to the sensing plane. The sensor plane is held parallel to a tangent to an outer surface of a conductor (1010) through which current (I) to be sensed flows, with the second plane approximately centered on the axis of the conductor (1010). The magnetic fields about the conductor (1010) are sensed, to thereby produce current (I)-representative signals from each of the current (I) sensors. Finally, the current (I)-representative signals from the two current (I) sensors are summed to produce a signal representative of the actual current (I) in the conductor (1010).

In one mode of the method for noncontact measurement, the current (I) to be sensed is an alternating current (I). In this mode, the step of procuring two current (I) sensors includes the step of procuring two current (I) sensors which respond to the absolute value of magnetic field, and the summing step includes the step of subtraction of one of the current (I)-representative signals from the other. The processing can be performed in analog or digital form.

In accordance with another aspect of the invention, an apparatus for measuring current (I) in a current (I)-carrying conductor (1010) comprises a first (1903) current (I) sensing device (preferably a corrected current sensing device) which can be magnetically coupled to the current (I) to be sensed, for generating a sensed signal relating to the magnitude of the current (I) being sensed. The first sensing device (1903) has a preferred magnetic sensing axis (1301). A second (1904) current (I) sensing device is included, which can be magnetically coupled to the current (I) to be sensed, for generating a sensed signal relating to the magnitude of the current (I) being sensed. The second (1904) current (I) sensing device also has a preferred magnetic sensing axis (1302). A nonmagnetic physical mounting (1310; 1310, 1510; 1910; 2010) is physically coupled to the first (1903) and second (1904) current (I) sensors, for holding the first (1903) and second (1904) current (I) sensors with their preferred magnetic sensing axes mutually orthogonal (1912), thereby defining a sensor plane (xy). The physical mounting (1310; 1310, 1510; 1910; 2010) is adapted for mounting adjacent an electrical conductor (1010), with the sensor plane (xy) parallel with a tangent (1010*t*) to an outer surface (1010*os*) of the electrical conductor (1010), for, when so mounted, holding the preferred magnetic sensing axes (1301, 1302) with a fixed angle between the direction of current (I) flow in the electrical conductor (1010) and the preferred sensing axis (1301, 1302) of one of the first (1903) and second (1904) current (I) sensors. An electrical coupling means or arrangement (1955) is coupled to the first (1903) and second (1904) current (I) sensors, for processing the sensed signals produced by the first (1903) and second (1904) current (I) sensors, to thereby produce a signal representative of the total current (I) in the electrical conductor (1010).

In one version of this apparatus, the electrical coupling means (1955) vectorially sums the currents (I) represented by the signals generated by the first (1903) and second (1904) current (I) sensing devices to produce the signal representative of total current (I) in the electrical conductor (1010). In a specific embodiment of this apparatus, the signals S3 and S4 generated by the first (1903) and second (1904) current (I) sensing devices in accordance with the expression $$\sqrt{|S3|^2+|S4|^2} = \sqrt{S^2\sin^2(\theta)+S^2\cos^2(\theta)} = S,$$

where $\Theta$ is the angle between S3 and S, produce a signal S representative of the total current (I) in the electrical conductor (1010).

In another version of an apparatus according to the other aspect of the invention, the apparatus comprises first (1903) and second (1904) (preferably corrected) magnetic sensors, each of which first (1903) and second (1904) magnetic sensors has a preferred magnetic sensing axis (1301, 1302). A first mounting (1310; 1310, 1910; 2010) means is coupled to the first (1903) and second (1904) magnetic sensors, for holding the first (1903) magnetic sensor with its preferred magnetic sensing axis (1301) orthogonal with the preferred magnetic sensing axis (1302) of the second (1904) magnetic sensor, to thereby define a sensing plane (xy). Second mounting (1510) means are coupled to the first mounting (1310; 1310, 1910; 2010) means and to the conductor (1010), for mounting the first mounting (1310; 1310, 1910; 2010) means adjacent (juxtaposed to) the conductor (1010), with the sensing plane (xy) generally parallel to a tangent (1010*t*) to an outer surface (1010*os*) of the conductor (1010). A summing means or arrangement (1955) is coupled to the first (1903) and second (1904) magnetic sensors, for vectorially summing the current (I)-representative signals of the first (1903) and second (1904) magnetic sensors, so as to compensate, or in such a fashion as to correct, yaw (illustrated in FIG. 18*e*) misalignment of the preferred magnetic sensing axes (1301, 1302) of the magnetic sensors (1903, 1904). In a particularly advantageous embodiment, the summing means performs its summing according to the expression $$\sqrt{|S3|^2+|S4|^2} = \sqrt{S^2\sin^2(\theta)+S^{2\cos^2(\theta)}} = S,$$

where S3 and S4 are the signals produced by the two magnetic field sensors, $\Theta$ is the angle between S3 and total magnetic field S, and S is proportional to the current flowing in the conductor.

In yet another version of the invention, a kit (1700) of nonmagnetic mounting (1310; 1310, 1510; 1910; 2010) arrangements is provided. Each of the mounting (1310; 1310, 1510; 1910; 2010) arrangements includes a first body arrangement (1701), defining (a) a mounting location (1711) for a pair of current (I) sensors (1903, 1904), each defining a preferred magnetic sensing axis (1301, 1302), for mounting the pair of current (I) sensors (1903, 1904) thereon with a fixed 90° angle between the preferred magnetic sensing axes (1301) of the current (I) sensors (1903, 1904), to thereby define a sensing plane (xy);

(b) a circularly cylindrical cavity (1721) defining a longitudinal axis (L1) lying parallel with a line (1310*a*) lying in the sensing plane and making a fixed 45° angle relative to the preferred magnetic sensing axes (1301, 1302) of the current (I) sensors (1903, 1904), and also defining a first radius (r1), for mounting to a cylindrical electrical conductor (1010) having a radius substantially equal to the first radius (r1), and with the sensing plane (xy) orthogonal to a plane (1016) parallel with the longitudinal axis (1010a); and a second body arrangement (1703), defining
  (a) a mounting location (1713) for said pair of current (I) sensors (1903, 1904), for mounting said pair of current (I) sensors (1903, 1904) thereon with a fixed 45° angle between the preferred magnetic sensing axes (1301, 1302) of the current (I) sensors (1903, 1904), to thereby define a sensing plane (xy);
  (b) a circularly cylindrical cavity (1723) defining a longitudinal axis (L3) lying parallel with a line (1310a) lying in the sensing plane (xy) and making a fixed 45° angle relative to the preferred magnetic sensing axes of the current (I) sensors, and also defining a second radius (r3) different from the first radius (r1), for mounting to a cylindrical electrical conductor (1010) having a radius substantially equal to the second radius (r3), and with the sensing plane (xy) orthogonal to a plane (1016) parallel with the longitudinal axis (L3).

Another kit of noncontacting magnetic sensors adapted for use with differing sizes of electrical conductors (1010) includes:

a first body arrangement (1701), which first body arrangement (1701) defines
  (a) a mounting location (1711) for a pair of (preferably corrected) current (I) sensors (1903, 1904), each defining a preferred magnetic sensing axis (1301, 1302), for mounting the pair of current (I) sensors (1903, 1904) thereon with a fixed 90° angle between the preferred magnetic sensing axes (1301, 1302) of the current (I) sensors (1903, 1904), to thereby define a sensing plane (xy);
  (b) a circularly cylindrical cavity (1721) defining a longitudinal axis (L1) lying parallel with a line (1310a) lying in the sensing plane (xy) and making a fixed 45° angle relative to the preferred magnetic sensing axes (1301, 1302) of the current (I) sensors (1903, 1904), and also defining a first radius (r1), for mounting to a cylindrical electrical conductor (1010) having a radius substantially equal to the first radius (r1), and with the sensing plane (xy) orthogonal to a plane (1016) parallel with the longitudinal axis (L1 or 1010a); and a second body arrangement (1703), which second body arrangement (1703) defines
  (a) a mounting location (1713) for said pair of (preferably corrected) current (I) sensors (1903, 1904), for mounting said pair of current (I) sensors (1903, 1904) thereon with a fixed 45° angle between the preferred magnetic sensing axes (1301, 1302) of the current (I) sensors (1903, 1904), [to thereby define a sensing plane];
  (b) a circularly cylindrical cavity (1723) defining a longitudinal axis (L3) lying parallel with a line (1310a) lying in the sensing plane (xy) and making a fixed 45° angle relative to the preferred magnetic sensing axes (1301, 1302) of said current (I) sensors (1903, 1904), and also defining a second radius (r3) different from the first radius (r1), for mounting to a cylindrical electrical conductor (1010) having a radius substantially equal to the second radius (r3), and with the sensing plane (xy) orthogonal to a plane (1016) parallel with the longitudinal axis (L3 or 1010a). The kit also includes a pair (1001) of magnetically coupled current (I) sensors, each defining a preferred magnetic sensing axis (1301, 1302), where the pair of current (I) sensors is dimensioned for mounting to any one of the first (1711) and second (1713) mounting locations of the first (1701) and second (1703) body arrangements, respectively.

A method for noncontact measurement of the current (I) in a conductor (1010) according to a further manifestation of the invention includes the step of procuring two current (I) sensors, each defining a preferred magnetic sensing axis (1301, 1302), and holding the current (I) sensors with the preferred magnetic sensing axes mutually orthogonal, to thereby define a sensor plane. The sensor plane is held parallel to a tangent to an outer surface of a conductor (1010) through which current (I) to be sensed flows. The magnetic fields about the conductor (1010) are sensed by the current (I) sensors, to thereby produce current (I)-representative signals from each of the current (I) sensors. The current (I)-representative signals from the current (I) sensors are processed to produce a signal representative of the actual current (I) in the conductor (1010). In a particular version of the method, the step of processing includes the step of determining the magnitude S of a magnetic field representing the total current in the electrical conductor by $$\sqrt{|S3|^2+|S4|^2}=\sqrt{S^2\sin^2(\Theta)+S^2\cos^2(\Theta)}=S$$

where S3 and S4 are the signals from the first and second current sensing devices, and $\Theta$ is the angle between S and S3.

What is claimed is:

1. An electrical current sensor arrangement for sensing the current in an elongated conductor, said arrangement comprising:
  a first current sensing device which can be magnetically coupled to the current to be sensed, for generating a sensed signal relating to the magnitude of the current being sensed, said first current sensing device having a preferred sensing axis;
  a second current sensing device which can be magnetically coupled to the current to be sensed, for generating a sensed signal relating to the magnitude of the current being sensed, said second current sensing device also having a preferred sensing axis;
  a nonmagnetic physical mounting physically coupled to said first and second current sensors, for holding said first and second current sensors with their preferred sensing axes one of parallel and orthogonal, thereby defining a sensor plane in which said current sensing devices lie with a spacing therebetween, said physical mounting being adapted for mounting adjacent an electrical conductor with said sensor plane parallel with a tangent with an outer surface of said electrical conductor, and for, when so mounted, holding said preferred sensing axes relative to the direction of current flow in said conductor so as to produce a sensed signal in at least one of said current sensing devices in response to current flow in said conductor, whereby, in general, each of said current sensing devices senses magnetic fields related to less than the total current flowing through said electrical conductor; and
  electrical coupling means coupled to said first and second current sensors, for processing said sensed signals produced by said first and second current sensors, to thereby produce a signal representative of the total current in said electrical conductor.

2. An electrical current sensor arrangement for sensing the current in an elongated conductor having a generally circular cross-section, said arrangement comprising:

a first current sensing device which can be magnetically coupled to the current to be sensed for generating a sensed signal relating to the magnitude of the current being sensed, said first sensing device having a preferred sensing axis;

a second current sensing device which can be magnetically coupled to the current to be sensed, for generating a sensed signal relating to the magnitude of the current being sensed, said second current sensing device also having a preferred sensing axis;

a nonmagnetic physical mounting physically coupled to said first and second current sensors, for holding said first and second current sensors with their preferred sensing axes parallel, thereby defining a sensor plane, and with a known spacing between said preferred sensing axes, said physical mounting being adapted for mounting adjacent an electrical conductor with said sensor plane parallel with a tangent with an outer surface of said electrical conductor, and for, when so mounted, holding said preferred sensing axes generally parallel with the direction of current flow in said electrical conductor, whereby each of said current sensing devices senses magnetic fields related to less than the total current flowing through said electrical conductor; and electrical coupling means coupled to said first and second current sensors, for processing said sensed signals produced by said first and second current sensors, to thereby produce a signal representative of the total current in said electrical conductor.

3. A current sensor arrangement according to claim 2, wherein said electrical coupling means sums the currents represented by the signals generated by said first and second current sensing devices to produce said signal representative of total current in said electrical conductor.

4. A current sensor arrangement according to claim 3, wherein said current sensing devices are corrected current sensing devices.

5. A current sensor arrangement according to claim 2, wherein said current sensing devices are corrected current sensing devices.

6. A current sensor arrangement according to claim 2, wherein said physical mounting comprises:

a first physical mounting portion physically coupled to said first and second current sensors, for holding said first and second current sensors with their preferred sensing axes parallel, thereby defining a sensor plane, and with a known spacing between said preferred sensing axes; and a second physical mounting portion for mounting adjacent an electrical conductor, said second physical mounting portion including means for holding said first physical mounting portion with said sensor plane parallel with a tangent with an outer surface of said electrical conductor, and for, when so mounted, holding said preferred sensing axes generally parallel with the direction of current flow in said electrical conductor.

7. A current sensor arrangement according to claim 6, wherein said first physical mounting portion comprises a printed-circuit board, and said second physical mounting portion comprises a nonmagnetic structure including a printed circuit mounting portion defining a plane, and also including a depression shaped to the exterior of said conductor, said depression defining a longitudinal axis parallel with said plane of said printed circuit mounting portion.

8. A kit of nonmagnetic mounting arrangements, each of said mounting arrangements including:

a first body arrangement, defining
  (a) a mounting location for a pair of current sensors, each defining a preferred magnetic sensing axis, for mounting a said pair of current sensors thereon with a specific distance between said current sensors, and with said preferred sensing axes parallel so as to define a sensing plane;
  (b) a circularly cylindrical cavity defining a longitudinal axis parallel with said preferred magnetic sensing axes of said current sensors and also defining a first radius, for mounting to a cylindrical electrical conductor having a radius substantially equal to said first radius, said longitudinal axis of said cavity being parallel with said preferred sensing axes, and said sensing plane orthogonal to a plane in which plural radii of said cavity lie; and a second body arrangement, defining
  (a) a second mounting location for said pair of current sensors, for mounting said pair of current sensors thereon with said specific distance between said current sensors of said pair, and with said preferred sensing axes parallel so as to define a second sensing plane;
  (b) a second circularly cylindrical cavity defining a second longitudinal axis parallel with said preferred magnetic sensing axes of said pair of current sensors and also defining a second radius, different from said first radius, for mounting to a cylindrical electrical conductor having a radius substantially equal to said second radius, said longitudinal axis of said second cavity being parallel with said preferred sensing axes, and said second sensing plane orthogonal to a plane in which plural radii of said cavity lie.

9. A kit of noncontacting magnetic sensors adapted for use with differing sizes of electrical conductors, said kit comprising:

a first body arrangement, said first body arrangement defining
  (a) a mounting location for a pair of current sensors, each defining a preferred magnetic sensing axis, for mounting a said pair of corrected current sensors thereon with a specific distance between said corrected current sensors, and with said preferred sensing axes parallel so as to define a sensing plane;
  (b) a circularly cylindrical cavity defining a longitudinal axis parallel with said preferred magnetic sensing axes of said current sensors and also defining a first radius, for mounting to a cylindrical electrical conductor having a radius substantially equal to said first radius, said longitudinal axis of said cavity being parallel with said preferred magnetic sensing axes, and said sensing plane orthogonal to a plane in which plural radii of said cavity lie; and a second body arrangement, said second body arrangement defining
  (a) a second mounting location for said pair of current sensors, for mounting said pair of current sensors thereon with said specific distance between said corrected current sensors of said pair, and with said preferred magnetic sensing axes parallel so as to define a second sensing plane;
  (b) a second circularly cylindrical cavity defining a second longitudinal axis parallel with said preferred magnetic sensing axes of said pair of corrected current sensors and also defining a second radius different from said first radius, for mounting to a cylindrical electrical conductor having a radius substantially equal to said second radius, said longitudinal axis of said second cavity being parallel with said preferred magnetic sensing axes, and said second sensing plane orthogonal to a plane in which plural radii of said cavity lie; and a pair of magnetically coupled current sensors, each defining a preferred magnetic sensing axis, said pair of current sensors being dimensioned for mounting to any one of said first and second mounting locations of said first and second body arrangements, respectively.

10. A kit according to claim 9, wherein each of said current sensors is a corrected current sensor.

11. A method for noncontact measurement of the current in a conductor, said method comprising the steps of:

procuring two current sensors, each defining a preferred magnetic sensing axis;

holding said current sensors with said preferred magnetic sensing axes mutually parallel and spaced apart from each other to define a sensor plane, and to also define a second plane parallel to said preferred magnetic sensing axes and orthogonal to said sensing plane;

holding said sensor plane parallel to a tangent to an outer surface of a conductor through which current to be sensed flows, with said second plane approximately centered on the axis of said conductor;

sensing the magnetic fields about said conductor to thereby produce current-representative signals from each of said current sensors; and summing said current-representative signals from said two current sensors to produce a signal representative of the actual current in said conductor.

12. A method according to claim 11, wherein said step of procuring two current sensors includes the step of procuring two corrected current sensors.

13. A method according to claim 11, wherein said current to be sensed is an alternating current, and wherein:

said step of procuring two current sensors includes the step of procuring two current sensors which respond to the absolute value of magnetic field; and said summing step includes the step of subtraction of one of said current-representative signals from the other.

14. An electrical current sensor arrangement for measuring current in a current-carrying conductor, said apparatus comprising:

a first current sensing device which can be magnetically coupled to the current to be sensed, for generating a sensed signal relating to the magnitude of the current being sensed, said first sensing device having a preferred magnetic sensing axis;

a second current sensing device which can be magnetically coupled to the current to be sensed, for generating a sensed signal relating to the magnitude of the current being sensed, said second current sensing device also having a preferred magnetic sensing axis;

a nonmagnetic physical mounting physically coupled to said first and second current sensors, for holding said first and second current sensors with their preferred magnetic sensing axes mutually orthogonal, thereby defining a sensor plane, said physical mounting being adapted for mounting adjacent an electrical conductor with said sensor plane parallel with a tangent to an outer surface of said electrical conductor, and for, when so mounted, holding said preferred magnetic sensing axes with a fixed angle between the direction of current flow in said electrical conductor and the preferred sensing axis of one of said first and second current sensors; and electrical coupling means coupled to said first and second current sensors, for processing said sensed signals produced by said first and second current sensors, to thereby produce a signal representative of the total current in said electrical conductor.

15. An electrical current sensor arrangement according to claim 14, wherein said electrical coupling means vectorially sums the currents represented by the signals generated by said first and second current sensing devices to produce said signal representative of total current in said electrical conductor.

16. An electrical current sensor arrangement according to claim 14, wherein said current sensing devices are corrected current sensing devices.

17. An electrical current sensor arrangement according to claim 14, wherein said electrical coupling means sums the currents represented by the signals generated by said first and second current sensing devices in accordance with the expression $$\sqrt{|S3|^2+|S4|^2}=\sqrt{S^2\sin^2(\theta)+S^2\cos^2(\theta)}=S,$$

where S3 and S4 are the signal from the first and second current sensing devices, and $\Theta$ is the angle between S and S3, to produce a signal S representative of the total current in said electrical conductor.

18. An electrical current sensor arrangement according to claim 14, wherein said current sensing devices are corrected current sensing devices.

19. An apparatus for measuring current in a current-carrying conductor, said apparatus comprising:

first and second magnetic sensors, each of said first and second magnetic sensors having a preferred magnetic sensing axis;

first mounting means coupled to said first and second magnetic sensors, for holding said first magnetic sensor with its preferred magnetic sensing axis orthogonal with the preferred magnetic sensing axis of said second magnetic sensor, to thereby define a sensing plane;

second mounting means coupled to said first mounting means and to said conductor, for mounting said first mounting means adjacent said conductor with said sensing plane generally parallel to a tangent to an outer surface of said conductor;

summing means coupled to said first and second magnetic sensors, for vectorially summing the current-representative signals of said first and second magnetic sensors, whereby yaw misalignment of said preferred magnetic sensing axes of said magnetic sensors is compensated.

20. An apparatus according to claim 19, wherein said summing means performs its summing according to the expression $$\sqrt{|S3|^2+|S4|^2}=\sqrt{S^2\sin^2(\theta)+S^2\cos^2(\theta)}=S,$$

where S3 and S4 are the signals from the first and second current sensors and $\Theta$ is the angle between current-representative signal S and signal S3.

21. An apparatus according to claim 19, wherein said first and second magnetic sensors are corrected magnetic sensors.

22. A kit of nonmagnetic mounting arrangements, each of said mounting arrangements including:

a first body arrangement, defining
  (a) a mounting location for a pair of current sensors, each defining a preferred magnetic sensing axis, for mounting said pair of current sensors thereon with a fixed 90° angle between said preferred magnetic sensing axes of said current sensors, to thereby define a sensing plane;

(b) a circularly cylindrical cavity defining a longitudinal axis lying parallel with a line lying in said sensing plane and making a fixed 45° angle relative to said preferred magnetic sensing axes of said current sensors, and also defining a first radius, for mounting to a cylindrical electrical conductor having a radius substantially equal to said first radius, and with said sensing plane parallel with a tangent to the outer surface of said electrical conductor; and a second body arrangement, defining (a) a mounting location for a pair of current sensors, each defining a preferred magnetic sensing axis, for mounting said pair of current sensors thereon with a fixed 90° angle between said preferred magnetic sensing axes of said current sensors, to thereby define a sensing plane;

(b) a circularly cylindrical cavity defining a longitudinal axis lying parallel with a line lying in said sensing plane and making a fixed 45° angle relative to said preferred magnetic sensing axes of said current sensors, and also defining a second radius different from said first radius, for mounting to a cylindrical electrical conductor having a radius substantially equal to said second radius, and with said sensing plane parallel with a tangent to the outer surface of said electrical conductor.

23. A kit of noncontacting magnetic sensors adapted for use with differing sizes of electrical conductors, said kit comprising:

a first body arrangement, said first body arrangement defining (a) a mounting location for a pair of current sensors, each defining a preferred magnetic sensing axis, for mounting said pair of current sensors thereon with a fixed 90° angle between said preferred magnetic sensing axes of said current sensors, to thereby define a sensing plane;

(b) a circularly cylindrical cavity defining a longitudinal axis lying parallel with a line lying in said sensing plane and making a fixed 45° angle relative to said preferred magnetic sensing axes of said current sensors, and also defining a first radius, for mounting to a cylindrical electrical conductor having a radius substantially equal to said first radius, and with said sensing plane orthogonal to a plane parallel with said longitudinal axis; and a second body arrangement, said second body arrangement defining (a) a mounting location for a pair of current sensors, each defining a preferred magnetic sensing axis, for mounting said pair of current sensors thereon with a fixed 90° angle between said preferred magnetic sensing axes of said current sensors, to thereby define a sensing plane;

(b) a circularly cylindrical cavity defining a longitudinal axis lying parallel with a line lying in said sensing plane and making a fixed 45° angle relative to said preferred magnetic sensing axes of said current sensors, and also defining a second radius different from said first radius, for mounting to a cylindrical electrical conductor having a radius substantially equal to said second radius, and with said sensing plane orthogonal to a plane parallel with said longitudinal axis; and a pair of magnetically coupled current sensors, each defining a preferred magnetic sensing axis, said pair of current sensors being dimensioned for mounting to any one of said first and second mounting locations of said first and second body arrangements, respectively.

24. A kit according to claim 23, wherein each of said current sensors is a corrected current sensor.

25. A method for noncontact measurement of the current in a conductor, said method comprising the steps of:

procuring two current sensors, each defining a preferred magnetic sensing axis;

holding said current sensors with said preferred magnetic sensing axes mutually orthogonal, to thereby define a sensor plane;

holding said sensor plane parallel to a tangent to an outer surface of a conductor through which current to be sensed flows;

sensing the magnetic fields about said conductor to thereby produce current-representative signals from each of said current sensors; and processing said current-representative signals from said current sensors to produce a signal representative of the actual current in said conductor.

26. A method according to claim 25, wherein said step of procuring two current sensors includes the step of procuring two corrected current sensors.

27. A method according to claim 25, wherein said step of processing includes the step of determining total current, represented by total magnetic field S, from:

$$\sqrt{|S3|^2+|S4|^2}=\sqrt{S^2\sin^2(\theta)+S^2\cos^2(\theta)}=S,$$

where S3 and S4 are the signals from the first and second current sensors and $\Theta$ is the angle between S and S3.

* * * * *